(12) United States Patent
Yi et al.

(10) Patent No.: US 11,638,385 B2
(45) Date of Patent: Apr. 25, 2023

(54) DISPLAY SUBSTRATE, METHOD FOR DRIVING THE SAME, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Hong Yi, Beijing (CN); Haigang Qing, Beijing (CN); Tiaomei Zhang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 126 days.

(21) Appl. No.: 17/430,699

(22) PCT Filed: Nov. 12, 2020

(86) PCT No.: PCT/CN2020/128430
§ 371 (c)(1),
(2) Date: Aug. 12, 2021

(87) PCT Pub. No.: WO2022/099549
PCT Pub. Date: May 19, 2022

(65) Prior Publication Data
US 2022/0352296 A1 Nov. 3, 2022

(51) Int. Cl.
*G09G 3/32* (2016.01)
*G09G 3/00* (2006.01)
(Continued)

(52) U.S. Cl.
CPC ......... *H10K 59/1315* (2023.02); *G09G 3/035* (2020.08); *G09G 3/3233* (2013.01);
(Continued)

(58) Field of Classification Search
CPC .... H10K 59/40; H10K 50/865; H10K 59/131; H10K 59/38; H10K 59/1315;
(Continued)

(56) References Cited

U.S. PATENT DOCUMENTS 11,574,992 B2 * 2/2023 Ma ..................... H10K 59/1315
2009/0146992 A1 6/2009 Fukunaga et al.
(Continued)

FOREIGN PATENT DOCUMENTS

CN 101452136 A 6/2009
CN 103117292 A 5/2013
(Continued)

*Primary Examiner* — Pegeman Karimi
(74) *Attorney, Agent, or Firm* — McCoy Russell LLP

(57) ABSTRACT

The present disclosure provides a display substrate, a method for driving the same, and a display device. The display substrate includes: a plurality of sub-pixels, a plurality of reset signal lines, a plurality of gate lines, a plurality of light emitting control signal lines, a plurality of data lines, a power signal line structure, an initialization signal line structure, and at least part of the reset signal lines extend along the first direction; the plurality of reset signal lines include a sub-reset signal line corresponding to each sub-pixel, and the sub-reset signal line includes a first reset
(Continued)

pattern and a second reset pattern that are coupled to each other, the first reset pattern is located between the substrate of the display substrate and the second reset pattern.

27 Claims, 19 Drawing Sheets

(51) Int. Cl.
*G09G 3/3233* (2016.01)
*H01L 27/12* (2006.01)

(52) U.S. Cl.
CPC . *H10K 59/1213* (2023.02); *G09G 2300/0426* (2013.01); *G09G 2300/0819* (2013.01); *G09G 2300/0842* (2013.01); *G09G 2310/0297* (2013.01); *G09G 2310/061* (2013.01); *G09G 2330/02* (2013.01); *H01L 27/1222* (2013.01)

(58) Field of Classification Search
CPC .. H10K 59/1213; H10K 59/00; G06F 1/1616; G06F 1/1643; G06F 3/0446; G06F 2203/04107; G06F 1/16; G06F 1/1615; G09G 3/035; G09G 3/3233; G09G 2300/0426; G09G 2300/0819; G09G 2300/0842; G09G 2310/0297; G09G 2310/061; G09G 2330/02; G09G 2310/027; G09G 2320/0209; G09G 2340/0435; G09G 2380/02; G09G 2310/0251; G09G 3/3241; H01L 27/1222

See application file for complete search history.

(56) References Cited

U.S. PATENT DOCUMENTS

| | | |
|---|---|---|
| 2011/0025671 A1 | 2/2011 | Lee |
| 2014/0111557 A1* | 4/2014 | Omata ................ G09G 3/3233 345/76 |
| 2016/0275870 A1* | 9/2016 | Kimura ................ G09G 3/3258 |
| 2016/0372049 A1* | 12/2016 | Wang .................. G09G 3/3283 |
| 2019/0088200 A1 | 3/2019 | Woo et al. |
| 2019/0197950 A1 | 6/2019 | Shibusawa |
| 2019/0288052 A1 | 9/2019 | Choi et al. |
| 2020/0006401 A1 | 1/2020 | Hwang et al. |
| 2021/0028259 A1* | 1/2021 | Xu ..................... H10K 59/1213 |

FOREIGN PATENT DOCUMENTS

| | | |
|---|---|---|
| CN | 104157240 A | 11/2014 |
| CN | 105304012 A | 2/2016 |
| CN | 109216425 A | 1/2019 |
| CN | 109545129 A | 3/2019 |
| CN | 110265410 A | 9/2019 |
| CN | 110660355 A | 1/2020 |
| CN | 110728267 A | 1/2020 |
| CN | 110767665 A | 2/2020 |
| CN | 111383580 A | 7/2020 |
| CN | 111584599 A | 8/2020 |

* cited by examiner

DISPLAY SUBSTRATE, METHOD FOR DRIVING THE SAME, AND DISPLAY DEVICE

CROSS REFERENCE TO RELATED APPLICATION

The present application is a U.S. National Phase of International Application No. PCT/CN2020/128430 entitled "DISPLAY SUBSTRATE, METHOD FOR DRIVING THE SAME, AND DISPLAY DEVICE," and filed on Nov. 12, 2020. The entire contents of the above-listed application are hereby incorporated by reference for all purposes.

TECHNICAL FIELD

The present disclosure relates to the field of display technology, in particular to a display substrate, a method for driving the same and a display device.

BACKGROUND

With the advancement of display technology, organic light emitting diode (OLED) displays have become one of the hot spots in the field of flat panel display research. More and more active matrix organic light emitting diodes (AMOLED) display panels enter the market. Compared with traditional thin-film transistor liquid crystal display panels, AMOLED display panels have the advantages of faster response speed, higher contrast, and wider viewing angles. With the development of technology, more and more electronic devices have begun to use bendable and flexible OLED displays that are thin and have good impact resistance. And with the gradual development of the market, people have greater requirements for the size of the screen and higher requirements for the refresh frequency.

SUMMARY

The present disclosure provides a display substrate, a method for driving the same and a display device.

In a first aspect, the present disclosure provides in some embodiments a display substrate, including: a plurality of sub-pixels, a plurality of reset signal lines, wherein at least part of the plurality of reset signal lines extend along a first direction; the plurality of reset signal lines include a sub-reset signal line corresponding to each sub-pixel, and the sub-reset signal line includes a first reset pattern and a second reset pattern coupled to each other, the first reset pattern is located between a substrate of the display substrate and the second reset pattern; a plurality of gate lines, at least part of the plurality of gate lines extending along the first direction; a plurality of light emitting control signal lines, at least part of the plurality of light emitting control signal lines extending along the first direction; a plurality of data lines, at least part of the plurality of data lines extending along a second direction, the first direction intersecting the second direction; a power signal line structure, at least part of the power signal line structure extending along the second direction; and an initialization signal line structure, at least part of the initialization signal line structure extending along the second direction.

Optionally, the sub-pixel includes a sub-pixel driving circuit, and a plurality of sub-pixel driving circuits of the plurality of sub-pixels are arranged in an array on the display substrate, the plurality of sub-pixel driving circuits form a plurality of repeating units arranged in an array, the sub-pixel driving circuit includes: a driving transistor, a compensation transistor, a data writing transistor, and a storage capacitor, a first electrode of the driving transistor is coupled to a second electrode of the data writing transistor, a second electrode of the driving transistor is coupled to a first electrode of the compensation transistor, and a gate electrode of the driving transistor is coupled to a second electrode of the compensation transistor; the gate electrode of the drive transistor is multiplexed as a first electrode plate of the storage capacitor; the driving transistor includes a channel region, the compensation transistor has a double-gate structure, and the compensation transistor includes a compensation active pattern.

Optionally, the plurality of data lines includes a plurality of first data lines and a plurality of second data lines, and the plurality of first data lines includes a first sub-data line corresponding to each sub-pixel, and the plurality of second data lines includes a second sub-data line corresponding to each sub-pixel, in each sub-pixel, the first electrode of the data writing transistor is coupled to the first sub-data line or the second sub-data line.

Optionally, the initialization signal line structure includes: a plurality of first initialization signal lines and a plurality of compensation initialization signal lines, at least part of the first initialization signal lines extend along the first direction, at least part of the compensation initialization signal lines extend along the second direction, and at least one compensation initialization signal line is coupled to at least one of the plurality of first initialization signal lines.

Optionally, each compensation initialization signal line is respectively coupled to the plurality of first initialization signal lines.

Optionally, the driving transistor includes a driving active pattern, in repeating units that are adjacent in the first direction, there is a first spacer region between driving active patterns of two driving transistors close to each other; in one repeating unit, there is a second spacer region between driving active patterns of two adjacent driving transistors along the first direction, and a width of the first spacer region in the first direction is greater than a width of the second spacer region.

Optionally, an orthographic projection of the compensation initialization signal line on the substrate at least partially overlaps an orthographic projection of the first spacer region on the substrate.

Optionally, the compensation active pattern includes: a first conductor portion, the first conductor portion serves as the second electrode of the compensation transistor, and at least part of the first conductor part extends to the channel region of the driving transistor along the second direction.

Optionally, the gate electrode of the driving transistor includes a gate main body and a gate protrusion portion, an orthographic projection of the gate protrusion portion on the substrate of the display substrate at least partially overlaps an orthographic projection of the second electrode plate of the storage capacitor on the substrate.

Optionally, the gate protrusion portion includes a first gate protrusion portion and a second gate protrusion portion, and the first gate protrusion portion and the second gate protrusion portion are symmetrically arranged.

Optionally, the plurality of gate lines includes a sub-gate line corresponding to each sub-pixel; in one sub-pixel, the gate electrode of the compensation transistor is coupled to the gate electrode of the data writing transistor in an adjacent sub-pixel, and an orthographic projection of the gate electrode of the compensation transistor on the substrate of the display substrate overlaps an orthographic projection of a corresponding sub-gate line on the substrate, the gate electrode of the compensation transistor is coupled to the corresponding sub-gate line through a via hole in the overlapping position.

Optionally, an orthographic projection of the sub-gate line on the substrate of the display substrate at least partially overlaps the orthographic projection of the second electrode of the compensation transistor on the substrate.

Optionally, wherein the second electrode plate of the storage capacitor includes a plate main body and two plate protrusion portions, and the plate main body is provided with an opening, a third spacer region is formed between the two plate protrusion portions.

Optionally, along the first direction, second electrode plates in adjacent sub-pixels are coupled together to form a coupling area, and along the second direction, a length of the coupling area is greater than or equal to a length of the plate main body.

Optionally, the sub-pixel further includes a first shielding pattern coupled to the second electrode plate of the storage capacitor, at least part of the shielding pattern extends along the second direction.

Optionally, an orthographic projection of the first shielding pattern on the substrate of the display substrate is arranged between the orthographic projection of the second electrode of the compensation transistor on the substrate, and the orthographic projection of the first electrode of the data writing transistor on the substrate.

Optionally, the sub-pixel further includes a second shielding pattern, and the second shielding pattern includes a first shielding portion and a second shielding portion coupled to each other, the first shielding portion is coupled to the first shielding pattern, at least part of the first shielding portion extends along the first direction, and at least part of the second shielding portion extends along the second direction.

Optionally, the compensation active pattern includes: two first semiconductor portions, and a second conductor portion coupled to the two first semiconductor portions, respectively; an orthographic projection of the second shielding portion on the substrate of the display substrate at least partially overlaps an orthographic projection of the second conductor portion on the substrate.

Optionally, the orthographic projection of the second shielding portion on the substrate of the display substrate overlaps an orthographic projections of the first sub-data line on the substrate.

Optionally, a part of the sub-pixels further includes a third shielding pattern coupled to the first shielding pattern; in a part of the sub-pixels, an orthographic projection of the third shielding pattern on the substrate of the display substrate overlaps an orthographic projection of the second sub-data line on the substrate.

Optionally, in at least part of the sub-pixels, the third shielding pattern is located on a first side of the first shielding pattern, the second shielding pattern is located on a second side of the first shielding pattern, and the first side is opposite to the second side along the first direction.

Optionally, the sub-pixel further includes: a reset transistor, wherein a first electrode of the reset transistor is coupled to the initialization signal line structure, and a second electrode of the reset transistor is coupled to the gate electrode of the driving transistor, the reset transistor includes a reset active pattern, the reset active pattern includes two second semiconductor portions, and a third conductor portion respectively coupled to the two second semiconductor portions; and a fourth shielding pattern, wherein the fourth shielding pattern is coupled to the power signal line structure, an orthographic projection of the fourth shielding pattern on the substrate of the display substrate at least partially overlaps an orthographic projection of the third conductor portion on the substrate.

Optionally, the plurality of first initialization signal lines include a sub-initialization signal line corresponding to each sub-pixel; in at least part of the sub-pixels, an orthographic projection of the sub-reset signal line on the substrate of the display substrate is located between an orthographic projection of the sub-initialization signal line on the substrate and an orthographic projection of the fourth shielding portion on the substrate.

Optionally, the power signal line structure includes: a first sub-power supply line corresponding to each sub-pixel and a second sub-power supply line corresponding to each sub-pixel, at least part of the first sub-power supply line extends along the first direction, and at least part of the second sub-power supply line extends along the second direction; in one sub-pixel, the first sub-power supply line is coupled to the second sub-power supply line, and the first sub-power supply line is coupled to the second electrode plate of the storage capacitor.

Optionally, in a same repeating unit, first sub-power supply lines located in a same row along the first direction are sequentially coupled, and in an adjacent repeating unit, there is a fourth spacer region between two first sub-power supply lines closest to each other along the first direction.

Optionally, an orthographic projection of the compensation initialization signal line on the substrate at least partially overlaps an orthographic projection of the fourth spacer region on the substrate.

Optionally, the sub-pixel further includes a first conductive connection portion; in one sub-pixel, the first sub-power supply line is coupled to the first conductive connection portion, an orthographic projection of the first conductive connection portion on the substrate at least partially overlaps an orthographic projection of the second sub-power supply line on the substrate, and the first conductive connection portion is coupled to the second sub-power supply line through a via hole at the overlapping position.

Optionally, the first conductive connection portion includes: U-shaped sub-connecting portion, one end of the U-shaped sub-connecting portion is coupled to the first sub-power supply line in a sub-pixel to which the U-shaped sub-connecting portion belongs, and another end of the U-shaped sub-connecting portion is connected to a first sub-power supply line in an adjacent sub-pixel; a first sub-connection portion coupled to the U-shaped sub-connection portion, an orthographic projection of the first sub-connection portion on the substrate of the display substrate overlaps the orthographic projection of the second sub-power supply line on the substrate, and the first sub-connecting portion and the second sub-power supply line are coupled through a via hole in the overlapping position.

Optionally, at least part of the second sub-power supply line includes a power supply straight side portion and a power supply bending portion, at least part of the power supply straight side portion extends along the second direction, there is an angle between the power supply bending portion and the power supply straight side portion.

Optionally, the angle a satisfies: $90° \leq a < 180°$.

Optionally, the sub-pixel further includes a second conductive connection portion, and at least part of the second conductive connection portion extends along the second direction; a first end of the second conductive connection portion is coupled to the gate electrode of the driving transistor, and a second end of the second conductive connection portion is coupled to the second electrode of the compensation transistor, an orthographic projection of the second end on the substrate at least partially overlaps the orthographic projection of the third spacer region on the substrate.

Optionally, the orthographic projection of the second conductive connecting portion on the substrate does not overlap the orthographic projection of the gate line on the substrate.

Optionally, a part of the sub-pixels further include: a third conductive connection portion, at least part of the third conductive connection portion extends along the first direction, in one sub-pixel, a first end of the third conductive connection portion is coupled to the first sub-data line, and a second end of the third conductive connection portion is coupled to the first electrode of the data writing transistor.

Optionally, at least part of the first sub-data line includes a first straight side portion and a first bending portion, and the first straight side portion extends along the second direction, there is an angle between the first bending portion and the first straight side portion; at least part of the second sub-data line includes a second straight side portion and a second bending portion, the second straight side portion extends along the second direction, and there is an angle between the second bending portion and the second straight side portion.

Optionally, the display substrate further includes: an insulating layer located between the third conductive connecting portion and the first sub-data line, a via hole is provided on the insulating layer, and the third conductive connection portion is coupled to the first sub-data line through the via hole; an orthographic projection of the via hole on the substrate at least partially overlaps an orthographic projection of the first bending portion on the substrate.

Optionally, the sub-pixel further includes an anode pattern and a fourth conductive connection portion, in one sub-pixel, the sub-pixel driving circuit is coupled to a corresponding anode pattern through the fourth conductive connection portion; at least part of the fourth conductive connection portion includes an extension portion extending along the second direction, and an orthographic projection of the extension portion on the substrate of the display substrate at least partially overlaps an orthographic projection of the anode pattern connected to the extension portion on the substrate.

Optionally, the sub-pixel includes a plurality of first sub-pixels, a plurality of second sub-pixels, and a plurality of third sub-pixels, a fourth conductive connection portion in the first sub-pixel has a first length in the second direction, a fourth conductive connection portion in the second sub-pixel has a second length in the second direction, a fourth conductive connection portion in the third sub-pixel has a third length in the second direction; the first length is greater than the second length, and the third length is greater than the third length.

In a second aspect, the present disclosure provides a display device including the display substrate.

Optionally, the plurality of data lines in the display substrate include a plurality of first data lines and a plurality of second data lines, the plurality of data lines are divided into a plurality of data line groups, and each data line group includes a first data line and a second data line, the display device further includes: a driver chip, the driver chip including a plurality of data signal output pins; a plurality of multiplexers, the input ends of the plurality of multiplexers being coupled to the plurality of data signal output pins in a one-to-one manner; the plurality of multiplexers correspond to the plurality of data line groups in a one-to-one manner, a first output end of the multiplexer is coupled to a first data line in a corresponding data line group, and a second output end of the multiplexer is coupled to a second data line in the corresponding data line group.

In a third aspect, the present disclosure provides a method for driving a display substrate, the display substrate includes: a plurality of sub-pixels, a plurality of reset signal lines, wherein at least part of the plurality of reset signal lines extend along a first direction; the plurality of reset signal lines include a sub-reset signal line corresponding to each sub-pixel, and the sub-reset signal line includes a first reset pattern and a second reset pattern coupled to each other, the first reset pattern is located between a substrate of the display substrate and the second reset pattern; a plurality of gate lines, at least part of the plurality of gate lines extending along the first direction; a plurality of light emitting control signal lines, at least part of the plurality of light emitting control signal lines extending along the first direction; a plurality of data lines, at least part of the plurality of data lines extending along a second direction, the first direction intersecting the second direction; a power signal line structure, at least part of the power signal line structure extending along the second direction; and an initialization signal line structure, at least part of the initialization signal line structure extending along the second direction, the driving method includes: scanning the plurality of gate lines row by row, when scanning the Nth gate line, a data signal is written into a first data line of the plurality of data lines, and when scanning the (N+1)th gate line, a data signal is written into a second data line of the plurality of data lines, a time for scanning the Nth gate line at least partially overlaps a time for scanning the (N+1)th gate line, and N is an odd or even number.

BRIEF DESCRIPTION OF THE DRAWINGS

The drawings described here are used to provide a further understanding of the present disclosure and constitute a part of the present disclosure. The exemplary embodiments of the present disclosure are used to explain the present disclosure, and do not constitute an improper limitation of the present disclosure.

DETAILED DESCRIPTION

In order to further illustrate a display substrate, a method for driving the same and a display device provided by the embodiments of the present disclosure, a detailed description will be given below with reference to the accompanying drawings.

In a large-size display screen, the length of the signal line inside the display screen is long, which easily causes the signal line to have a delay effect when transmitting signals, which affects the working performance of the display screen.

Figure 3:
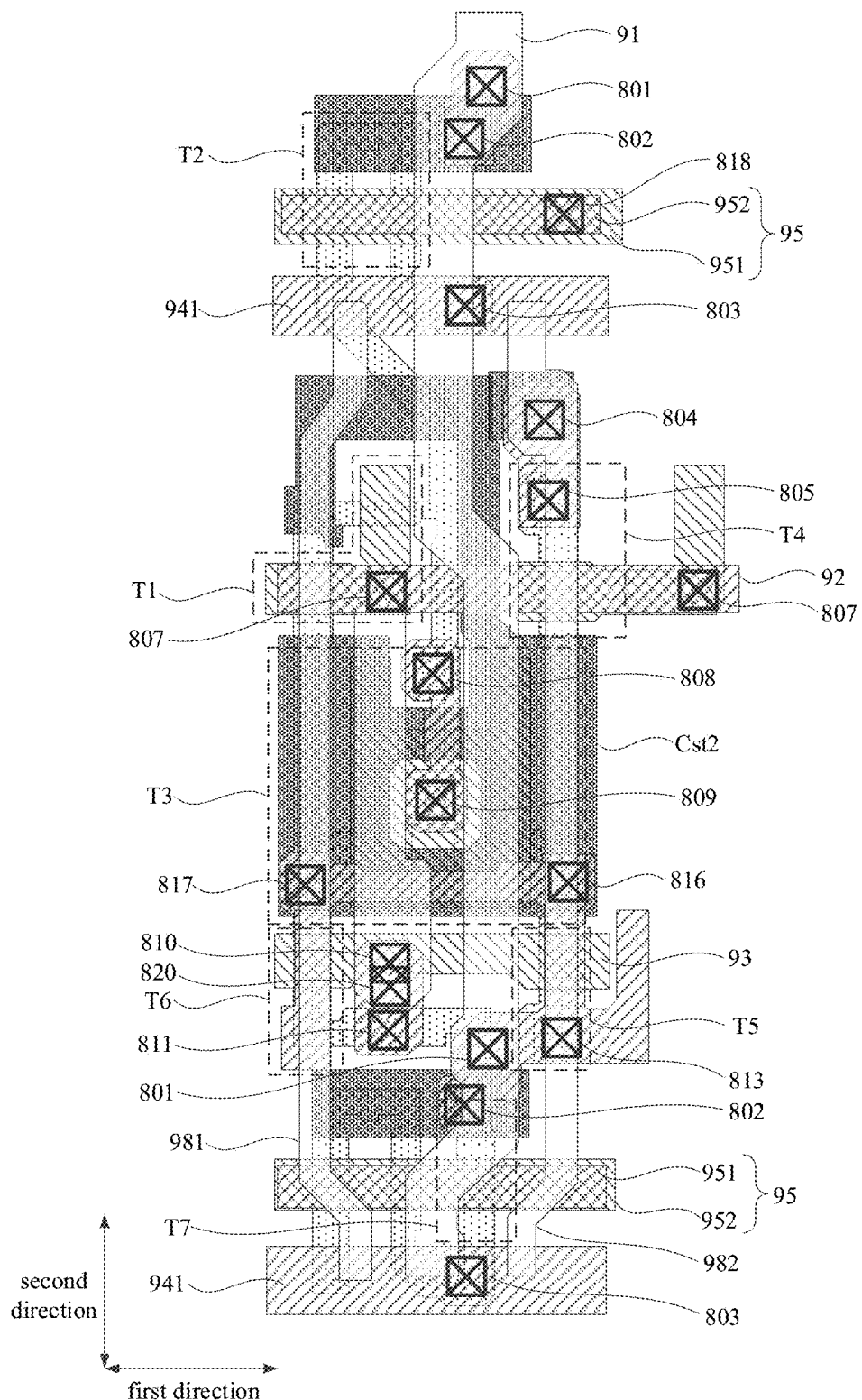
FIG. 3 is a schematic diagram of a first structure of a sub-pixel driving circuit provided by an embodiment of the disclosure.
Figure 4:
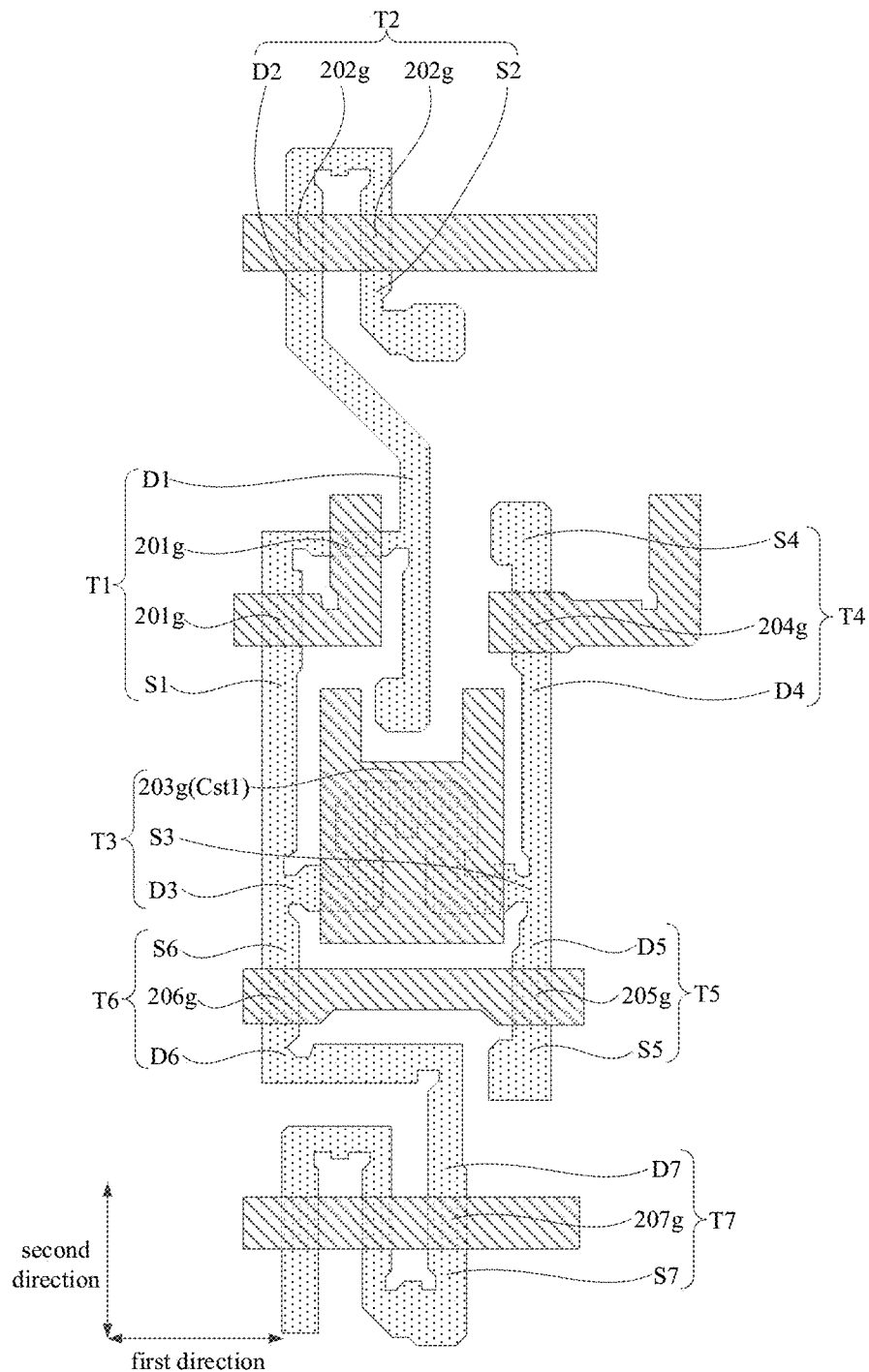
FIG. 4 is a schematic diagram of the active layer and the first gate metal layer in FIG. 3.
Figure 7:
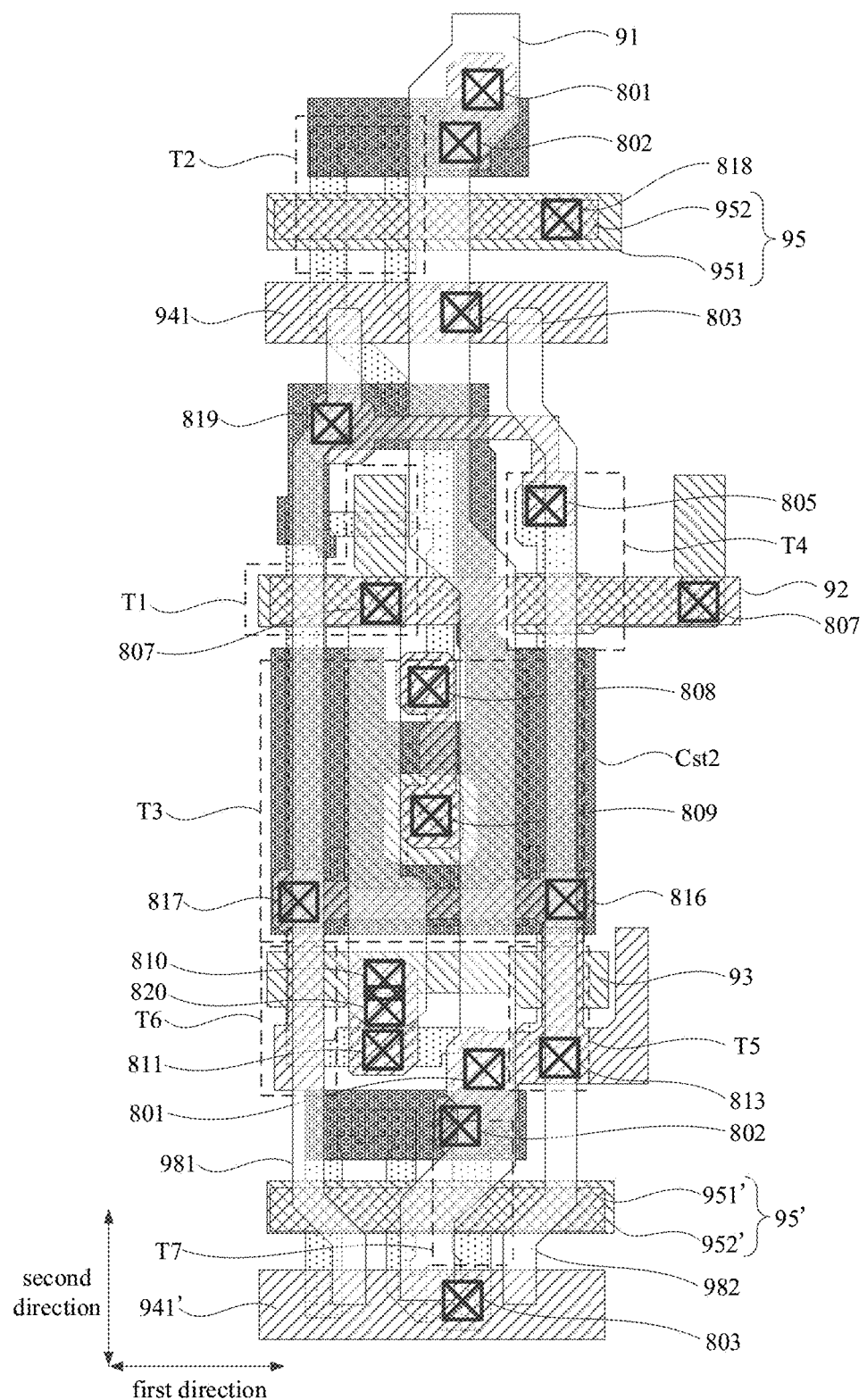
FIG. 7 is a schematic diagram of a second structure of a sub-pixel driving circuit provided by an embodiment of the disclosure.
Figure 8:
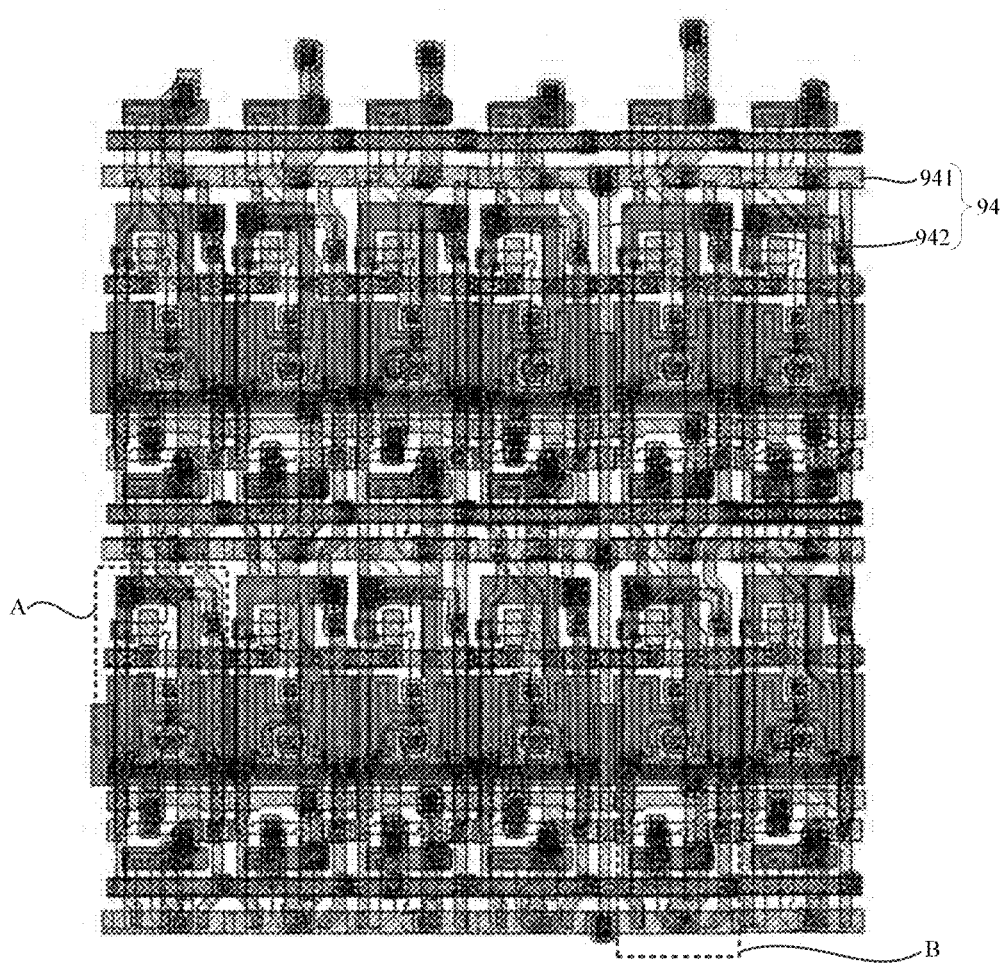
FIG. 8 is a schematic diagram of a layout of a plurality of sub-pixel driving circuits provided by an embodiment of the present disclosure.
Figure 9:
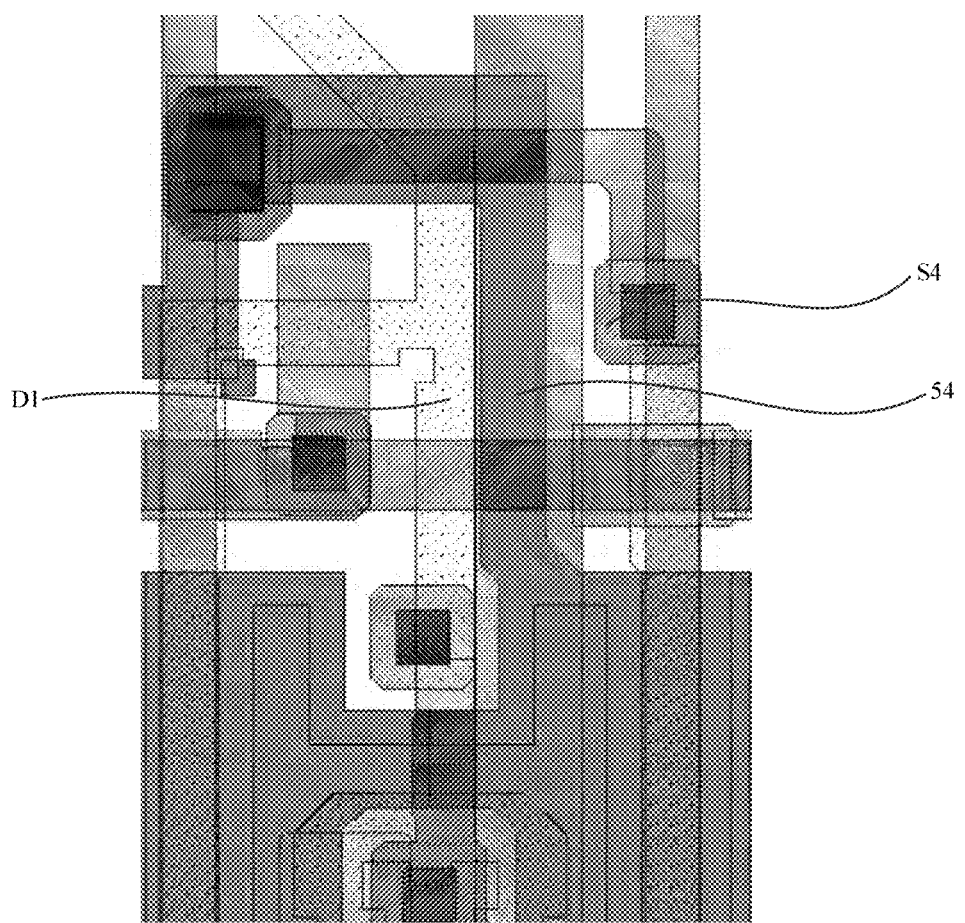
FIG. 9 is an enlarged schematic diagram of part A in FIG. 8.
Figure 10:
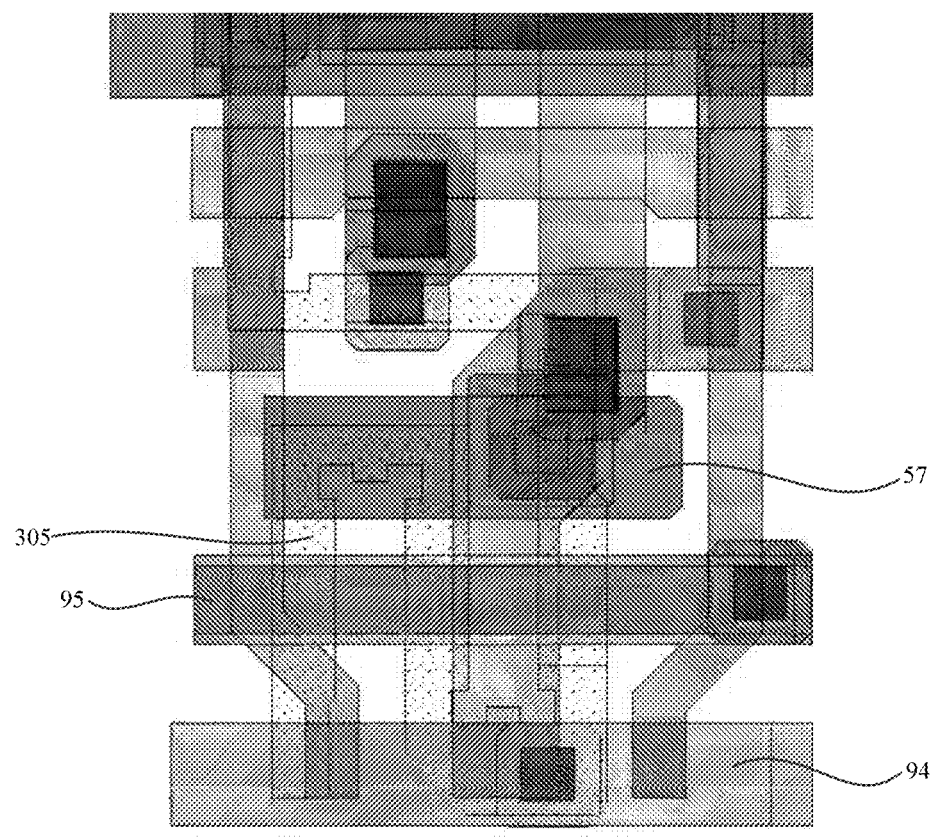
FIG. 10 is an enlarged schematic diagram of part B in FIG. 8.

Referring to FIGS. 3, 7 and 8, an embodiment of the present disclosure provides a display substrate, including: a plurality of sub-pixels, a plurality of reset signal lines, a plurality of gate lines, a plurality of light emitting control signal lines, a power signal line structure 91 and initialization signal line structure 94.

At least part of the reset signal lines extend along a first direction; the plurality of reset signal lines include a sub-reset signal line 95 corresponding to each of the sub-pixels, and the sub-reset signal line 95 includes a first reset pattern 951 and a second reset pattern 952 coupled to each other, the first reset pattern 951 is located between a substrate of the display substrate and the second reset pattern 952; at least part of the gate lines extend along the first direction; at least part of the light emitting control signal lines extend along the first direction; a plurality of data lines, at least part of the data lines extend along a second direction, the first direction intersects the second direction; at least part of the power signal line structure 91 extends along the second direction; at least part of the initialization signal line structure 94 extends along the second direction.

Exemplarily, the first direction includes a horizontal direction, and the second direction includes a vertical direction.

The plurality of sub-pixels are arranged in an array, the plurality of sub-pixels can be divided into a plurality of rows of sub-pixels, the plurality of rows of sub-pixels are arranged along the second direction, and each row of sub-pixels includes a plurality of sub-pixels arranged along the first direction. The plurality of sub-pixels can be divided into a plurality of columns of sub-pixels, the plurality of columns of sub-pixels are arranged along the first direction, and each column of sub-pixels includes a plurality of sub-pixels arranged along the second direction.

The sub-pixel includes a sub-pixel driving circuit, and a plurality of sub-pixel driving circuits of the plurality of sub-pixels are arranged in an array on the display substrate.

Exemplarily, the plurality of reset signal lines are arranged along the second direction, the plurality of reset signal lines correspond to a plurality of rows of sub-pixels in a one-to-one manner, and each reset signal line includes a plurality of sub-reset signal lines 95, so the plurality of sub-reset signal lines 95 correspond to each sub-pixel in a corresponding row of sub-pixels in a one-to-one manner, and the plurality of sub-reset signal lines 95 are coupled in sequence.

Exemplarily, the sub-reset signal line 95 includes a first reset pattern 951 and a second reset pattern 952, the first reset pattern 951 is located between the substrate and the second reset pattern 952. The orthographic projection of the first reset pattern 951 on the substrate and the orthographic projection of the second reset pattern 952 on the substrate form an overlapping area, and the first reset pattern 951 is coupled to the second reset pattern 952 through an eighteenth via hole 818 arranged on the overlapping area. The eighteenth via hole 818 penetrates the second gate insulating layer and the interlayer insulating layer.

Exemplarily, at least part of the first reset pattern 951 extends along the first direction, and the first reset patterns 951 located in the same row along the first direction are sequentially coupled to form an integral structure.

Exemplarily, at least a part of the second reset pattern 952 extends along the first direction, and the second reset patterns 952 located in the same row along the first direction are sequentially coupled to form an integral structure.

Exemplarily, the display substrate includes: an active layer, a first gate insulating layer, a first gate metal layer, a second gate insulating layer, and a second gate metal layer, an interlayer insulating layer, a first source-drain metal layer, a first planarization layer, a second source-drain metal layer, a second planarization layer, an anode layer, an organic light emitting function layer and a cathode layer sequentially stacked in a direction away from the substrate.

Exemplarily, the first reset pattern 951 is formed in the first gate metal layer.

Exemplarily, the second reset pattern 952 is formed in the first source-drain metal layer.

Exemplarily, the plurality of gate lines are arranged along the second direction, the plurality of gate lines correspond to a plurality of rows of sub-pixels in a one-to-one manner, and each gate line includes a plurality of sub-gate lines 92, and the plurality of sub-gate lines 92 corresponds to each sub-pixel in the corresponding row of sub-pixels in a one-to-one manner, and the plurality of sub-gate lines 92 are sequentially coupled to form an integral structure.

Exemplarily, the plurality of gate lines are formed in the first source-drain metal layer.

Exemplarily, the plurality of light emitting control signal lines are arranged along the second direction, the plurality of light emitting control signal lines correspond to a plurality of rows of sub-pixels in a one-to-one manner, and each light emitting control signal line includes a plurality of sub-light emitting control signal line 93s, the plurality of sub-light emitting control signal lines 93 corresponds to each sub-pixel in the corresponding row of sub-pixels in a one-to-one manner, and the plurality of sub-light emitting control signal lines 93 are sequentially coupled to form an integral structure.

Exemplarily, the plurality of light emitting control signal lines are formed in the first source-drain metal layer.

Exemplarily, the power signal line structure 91 is formed in a grid shape.

Exemplarily, the initialization signal line structure 94 is formed in a grid shape.

According to the specific structure of the above display substrate, in the display substrate provided by the embodiment of the present disclosure, the reset signal line includes the sub-reset signal line 95 corresponding to each sub-pixel, and each of the sub-reset signal lines 95 includes a first reset pattern 951 and a second reset pattern 952 coupled to each other, so that the reset signal line can still have a lower resistance even when the reset signal line has a longer length, thereby improving the delay function of the reset signal line during the transmission of the reset signal and improving the stability of the display substrate.

As shown in FIGS. 1, 3, 7 and 14, in some embodiments, the sub-pixel includes a sub-pixel driving circuit, and the plurality of sub-pixel driving circuits of the plurality of sub-pixels are arranged in an array on the display substrate.

The plurality of sub-pixel driving circuits form a plurality of repeating units 40 arranged in an array.

The sub-pixel driving circuit includes: a driving transistor (such as a third transistor T3), a compensation transistor (such as a first transistor T1), a data writing transistor (such as a fourth transistor T4), and a storage capacitor Cst.

The first electrode of the driving transistor is coupled to the second electrode of the data writing transistor, the second electrode of the driving transistor is coupled to the first electrode of the compensation transistor, and the gate electrode of the driving transistor is coupled to the second electrode of the compensation transistor; the gate electrode of the drive transistor is multiplexed as the first electrode plate of the storage capacitor Cst; the driving transistor includes a channel region.

The compensation transistor has a double-gate structure, and the compensation transistor includes a compensation active pattern.

Specifically, the sub-pixel includes a sub-pixel driving circuit, and the plurality of sub-pixel driving circuits of the plurality of sub-pixels are arranged in an array on the display substrate. The plurality of sub-pixel driving circuits can be divided into a plurality of rows of sub-pixel driving circuits, the plurality of rows of sub-pixel driving circuits are arranged along the second direction, and each row of sub-pixel driving circuits includes a plurality of sub-pixel driving circuits arranged along the first direction. The plurality of sub-pixel driving circuits can be divided into a plurality of columns of sub-pixel driving circuits, the plurality of columns of sub-pixel driving circuits are arranged along the first direction, and each column of sub-pixel driving circuits includes a plurality sub-pixel driving circuits arranged along the second direction.

Exemplarily, the plurality of sub-pixel driving circuits form a plurality of repeating units 40 arranged in an array, and each repeating unit 40 includes a plurality of sub-pixel driving circuits arranged in an array.

Exemplarily, the plurality of repeating units 40 can be divided into a plurality of rows of repeating units 40, the plurality of rows of repeating units 40 are arranged along the second direction, and each row of the repeating units 40 includes a plurality of repeating units 40 arranged along the first direction. The plurality of repeating units 40 can be divided into a plurality of columns of repeating units 40, the plurality of columns of repeating units 40 are arranged along the first direction, and each column of the repeating units 40 includes a plurality of repeating units 40 arranged along the second direction.

Exemplarily, each repeating unit 40 includes 12 sub-pixel driving circuits, and the 12 sub-pixel driving circuits are arranged in two rows and six columns.

Exemplarily, the sub-pixel driving circuit includes 7T1C, that is, seven transistors and one capacitor.

Exemplarily, the sub-pixel driving circuit includes: a driving transistor, a compensation transistor, a data writing transistor, and a storage capacitor Cst.

Figure 11:
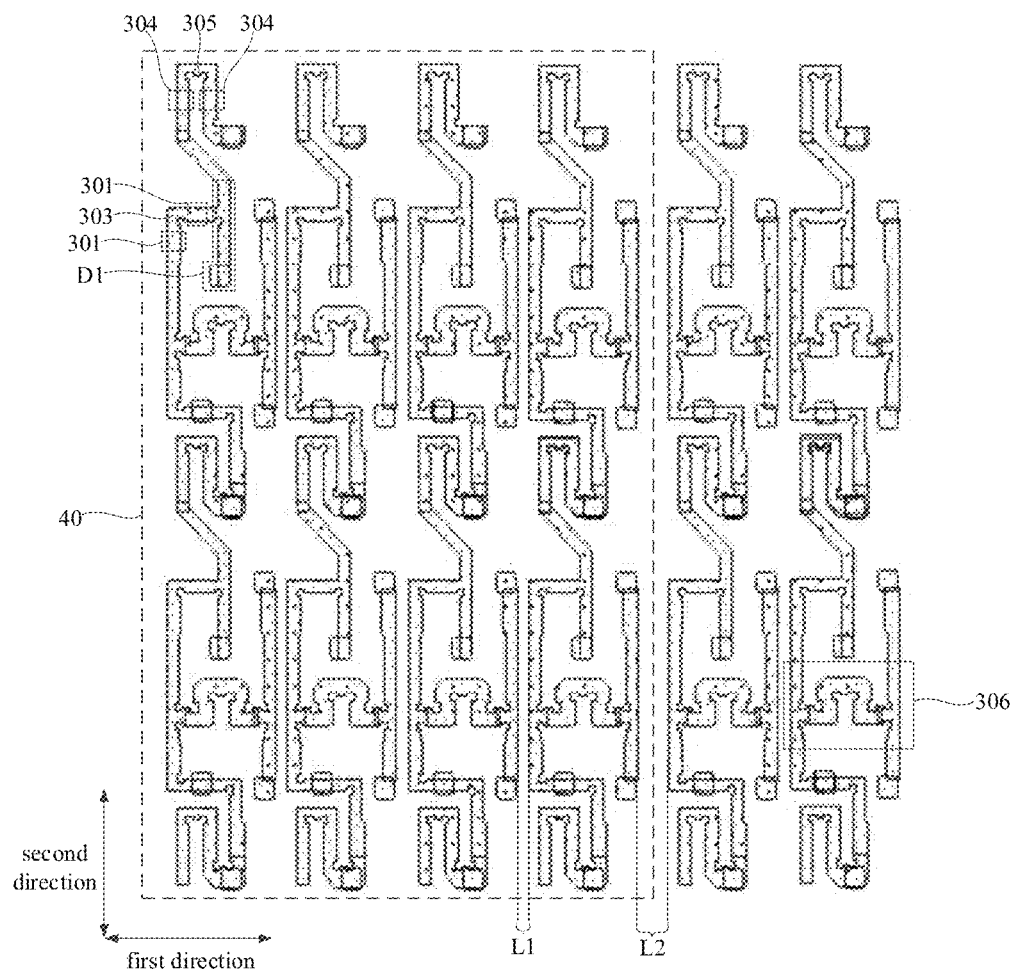
FIG. 11 is a schematic diagram of the active layer in FIG. 8.

Exemplarily, as shown in FIG. 11, the driving transistor includes a driving active pattern 306, the orthographic projection of the gate electrode of the driving transistor on the substrate and the orthographic projection of the driving active pattern 306 on the substrate forms an overlapping area, and the overlapping area is the channel region of the driving transistor.

As shown in FIGS. 1, 3, 5, 7 and 15, in some embodiments, the plurality of data lines includes a plurality of first data lines and a plurality of second data lines, and the plurality of first data lines includes a first sub-data line 981 corresponding to each sub-pixel, and the plurality of second data lines includes a second sub-data line 982 corresponding to each sub-pixel. In each of the sub-pixels, the first electrode of the data writing transistor is coupled to the first sub-data line 981 or the second sub-data line 982.

Exemplarily, the plurality of data lines are arranged along the first direction, the plurality of data lines include a plurality of first data lines and a plurality of second data lines, and the plurality of first data lines and plurality of second data lines can be divided into a plurality of data line groups, and each data line group includes one first data line and one second data line, and each data line can only belong to one data line group.

Exemplarily, the plurality of data line groups are arranged along the first direction, the plurality of data line groups correspond to a plurality of columns of sub-pixels in a one-to-one manner, the first data line includes a plurality of first sub-data lines 981, and the plurality of first sub-data lines 981 corresponds to each sub-pixel in a corresponding column of sub-pixels in a one-to-one manner, and the plurality of first sub-data lines 981 are sequentially coupled to form an integral structure; the second data line includes a plurality of second sub-data lines 982, the plurality of second sub-data lines 982 corresponds to each sub-pixel in a corresponding column of sub-pixels, and the plurality of second sub-data lines 982 are sequentially coupled to form an integral structure.

Exemplarily, in one sub-pixel, the corresponding first sub-data line 981 and the corresponding second sub-data line 982 are arranged opposite to each other along the first direction.

Exemplarily, the plurality of data lines are forming in the same layer of the second source-drain metal layer.

Exemplarily, in one column of sub-pixels, the first electrode of the data writing transistor in an odd-numbered sub-pixel is coupled to the first sub-data line 981, and the first electrode of the data writing transistor in an even-numbered sub-pixel is coupled to the second sub-data line 982.

Exemplarily, in one column of sub-pixels, the first electrode of the data writing transistor in an even-numbered sub-pixels is coupled to the first sub-data line 981, and the first electrode of the data writing transistor in an odd-numbered sub-pixel is coupled to the second sub-data line 982.

Exemplarily, in an odd-numbered column of sub-pixels, the first electrode of the data writing transistor in an odd-numbered sub-pixel is coupled to the first sub-data line 981, and the first electrode of the data writing transistor in an even-numbered sub-pixel is coupled to the second sub-data line 982; in an even-numbered column of sub-pixels, the first electrode of the data writing transistor in an even-numbered sub-pixel is coupled to the first sub-data line 981, the first electrode of the data writing transistor in an odd-numbered sub-pixel is coupled to the second sub-data line 982.

Exemplarily, in an even-numbered column of sub-pixels, the first electrode of the data writing transistor in an odd-numbered sub-pixel is coupled to the first sub-data line 981, and the first electrode of the data writing transistor in an even-numbered sub-pixel is coupled to the second sub-data line 982; in the odd-numbered column of sub-pixels, the first electrode of the data writing transistor in the even-numbered sub-pixel is coupled to the first sub-data line 981, the first electrode of the data writing transistor in an odd-numbered sub-pixel is coupled to the second sub-data line 982.

In the display substrate provided by the above embodiment, each sub-pixel corresponds to the first sub-data line 981 and the second sub-data line 982, and in the same column of sub-pixels, the data writing transistors in adjacent sub-pixels are coupled to different data lines, so that in the same column of sub-pixels, adjacent sub-pixels are provided with data signals from different sub-data lines, thereby ensuring that each sub-pixel has sufficient data signal writing time, and solving the problem that the data signal writing time of each row of sub-pixels is insufficient during the high frequency display of the display substrate.

As shown in FIG. 3, FIG. 7, FIG. 8, FIG. 14, FIG. 15, and FIG. 18, in some embodiments, the initialization signal line structure 94 includes: a plurality of first initialization signal lines and a plurality of compensation initialization signal lines 942. At least part of the first initialization signal lines extend along the first direction, at least part of the compensation initialization signal lines 942 extend along the second direction, and at least one of the compensation initialization signal line 942 is coupled to at least one of the plurality of first initialization signal lines.

Exemplarily, the plurality of first initialization signal lines are arranged along the second direction, the plurality of first initialization signal lines correspond to a plurality of rows of sub-pixels in a one-to-one manner, and each first initialization signal line includes a plurality of sub-initialization signal lines 941, the plurality of sub-initialization signal lines 941 correspond to sub-pixels in the corresponding row of sub-pixels in a one-to-one manner, and the plurality of sub-initialization signal lines 941 are sequentially coupled to form an integral structure.

Exemplarily, the plurality of first initialization signal lines are formed in the first source-drain metal layer.

Exemplarily, the plurality of compensation initialization signal lines 942 are arranged along the first direction, the plurality of compensation initialization signal lines 942 correspond to a plurality of columns of repeating units 40 in a one-to-one manner, and the compensation initialization signal lines 942 is coupled to the sub-initialization signal line 941 included in a corresponding column of repeating units 40.

Exemplarily, the compensation initialization signal line 942 is located at one side of the corresponding column of repeating units 40.

Exemplarily, the compensation initialization signal line 942 is located inside the corresponding row of repeating units 40.

Exemplarily, the plurality of compensation initialization signal lines 942 are formed in the second source-drain metal layer.

In the foregoing embodiment, the initialization signal line structure 94 is configured to include: a plurality of first initialization signal lines and a plurality of compensation initialization signal lines 942, so that the overall resistance of the initialization signal line structure 94 is reduced, thereby effectively reducing the resistance of the initialization signal line structure 94, improving the IR Drop generated on the initialization signal line structure 94.

Figure 18:
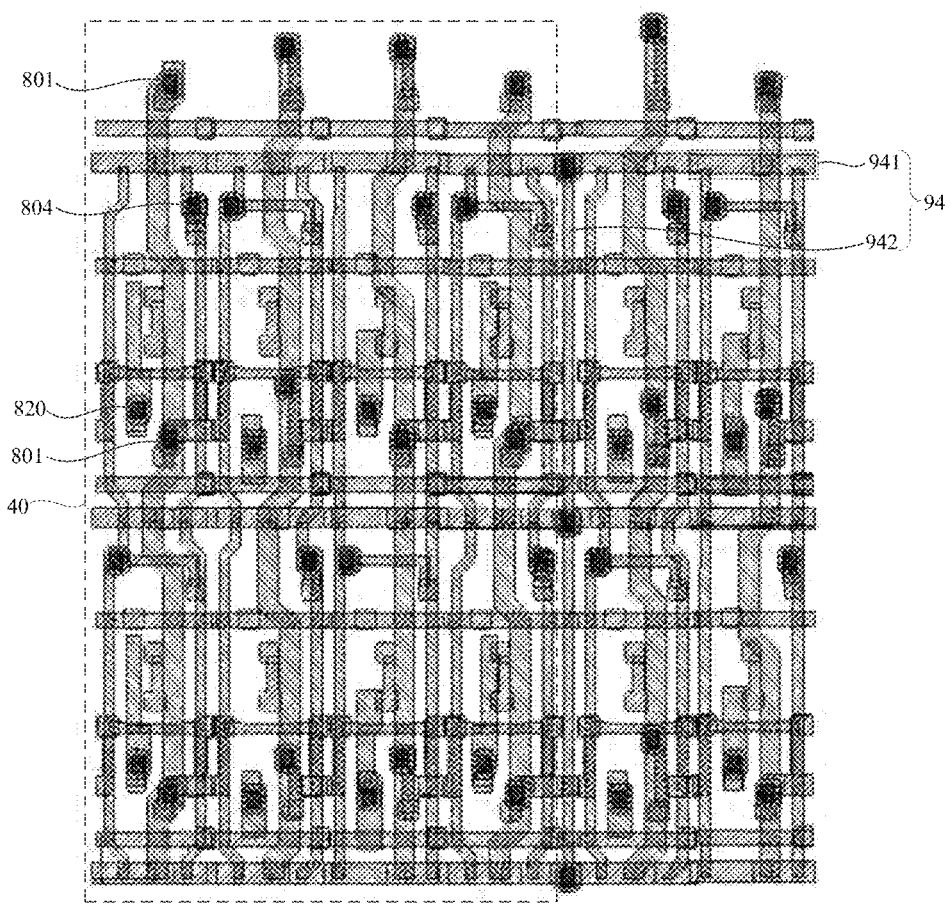
FIG. 18 is a schematic diagram of the first source-drain metal layer and the second source-drain metal layer in FIG. 8.

As shown in FIG. 18, in some embodiments, each of the compensation initialization signal lines 942 is respectively coupled to the plurality of first initialization signal lines.

The above arrangement method further reduces the resistance of the initialization signal line structure 94 and improves the IR Drop generated on the initialization signal line structure 94.

As shown in FIGS. 1, 3, 7, 8 and 11, in some embodiments, the driving transistor includes a driving active pattern 306.

In repeating units 40 that are adjacent in the first direction, there is a first spacer region between the driving active patterns 306 of two adjacent driving transistors; in one repeating unit 40, there is a second spacer region between the driving active patterns 306 of the two adjacent driving transistors along the first direction, and the width L1 of the first spacer region in the first direction is greater than the width L2 of the second spacer region.

Specifically, the driving active pattern 306 includes a semiconductor portion and a conductor portion. The orthographic projection of the semiconductor portion on the substrate overlaps the orthographic projection of the gate electrode of the driving transistor on the substrate. The conductor part is used to form the first electrode and the second electrode of the driving transistor, at least part of the first electrode extends in the second direction, and at least part of the second electrode extends in the first direction.

Exemplarily, the first spacer region refers to: among the two driving transistors that are close to each other in the first direction in adjacent repeating units 40 along the first direction, an area formed between a first electrode of one driving transistor and a second electrode of another driving transistor.

Exemplarily, the second spacer region refers to: among two driving transistors that are close to each other in the first direction in a repeating unit 40, an area formed between the first electrode of one driving transistor and the second electrode of the other driving transistor.

As shown in FIG. 8, in some embodiments, the orthographic projection of the compensation initialization signal line 942 on the substrate at least partially overlaps the orthographic projection of the first spacer region on the substrate.

The above arrangement method effectively reduces the overlapping area between the compensation initialization signal line 942 and the active layer in the display substrate, reduces the parasitic capacitance in the display substrate, and improves the stability of the display substrate.

As shown in FIG. 11, in some embodiments, the compensation active pattern includes: a first conductor portion, the first conductor portion serves as the second electrode of the compensation transistor (that is, the second electrode D1 of the first transistor T1), and at least part of the first conductor part extends to the channel region of the driving transistor along the second direction.

Exemplarily, the compensation transistor is a double-gate transistor, the compensation transistor includes a compensation active pattern, and the compensation active pattern includes: two first semiconductor portions 301; a second conductor portion 303 coupled to the two first semiconductor portions 301, respectively; a first conductor portion coupled to one first semiconductor portion 301, and a fourth conductor portion coupled to the other first semiconductor portion 301.

The orthographic projection of the two first semiconductor portions 301 on the substrate overlaps the orthographic projection of the gate electrode of the compensation transistor on the substrate. The fourth conductor portion serves as the first electrode of the compensation transistor, and the first conductor portion serves as the second electrode of the compensation transistor.

Exemplarily, the orthographic projection of the first conductor portion on the substrate at least partially overlaps the orthographic projection of a sub-gate line 92 corresponding to a sub-pixel to which the first conductor portion belongs on the substrate.

The above arrangement at least part of the first conductor portion extends to the channel region of the driving transistor along the second direction, so that the distance between the first conductor portion and the gate electrode of the driving transistor is shortened, when the first conductor portion is coupled to the gate electrode of the driving transistor, the second conductive connection portion 62 for coupling the first conductor portion and the gate electrode of the driving transistor will not be in a short circuit with the gate line.

Figure 12:
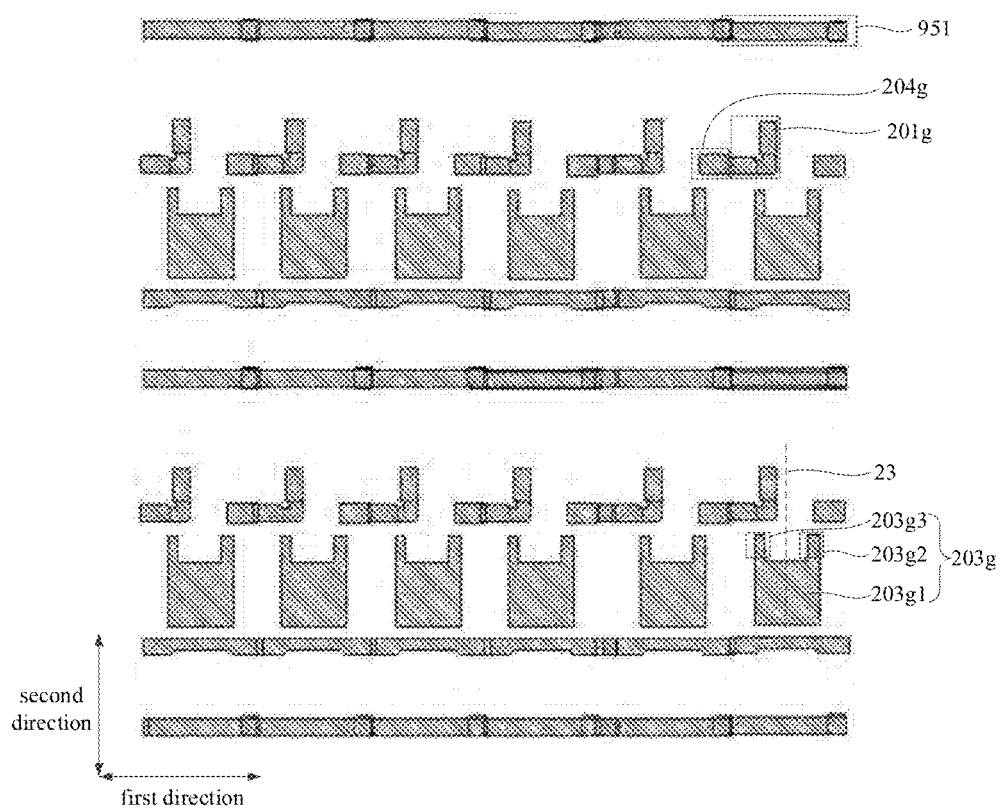
FIG. 12 is a schematic diagram of the first gate metal layer in FIG. 8.

As shown in FIG. 12, in some embodiments, the gate electrode of the driving transistor includes a gate main body 203g1 and a gate protrusion portion. The orthographic projection of the gate protrusion portion on the substrate of the display substrate at least partially overlaps the orthographic projection of the second electrode plate Cst2 of the storage capacitor Cst on the substrate.

Exemplarily, the gate main body 203g1 and the gate protrusion portion are formed as an integral structure.

Exemplarily, the orthographic projection of the gate protrusion portion on the substrate of the display substrate is located inside the orthographic projection of the second electrode plate of the storage capacitor Cst on the substrate.

Exemplarily, the orthographic projection of the gate main body 203g1 on the base of the display substrate at least partially overlaps the orthographic projection of the second electrode plate of the storage capacitor Cst on the substrate.

The above arrangement effectively increases the overlapping area between the gate electrode of the driving transistor and the second electrode plate of the storage capacitor Cst, so that when the gate electrode of the driving transistor is multiplexed as the first electrode plate of the storage capacitor Cst, the capacitance of the storage capacitor Cst is effectively increased.

In some embodiments, the gate protrusion portion includes a first gate protrusion portion 203g2 and a second gate protrusion portion 203g3, and the first gate protrusion portion 203g2 and the second gate protrusion portion 203g3 are symmetrically arranged.

Exemplarily, the first gate protrusion portion 203g2 and the second gate protrusion portion 203g3 are symmetrical with respect to the center line 23 of the gate main 203g1.

The above arrangement method further increases the overlapping area between the gate electrode of the driving transistor and the second electrode plate of the storage capacitor Cst.

Figure 14:
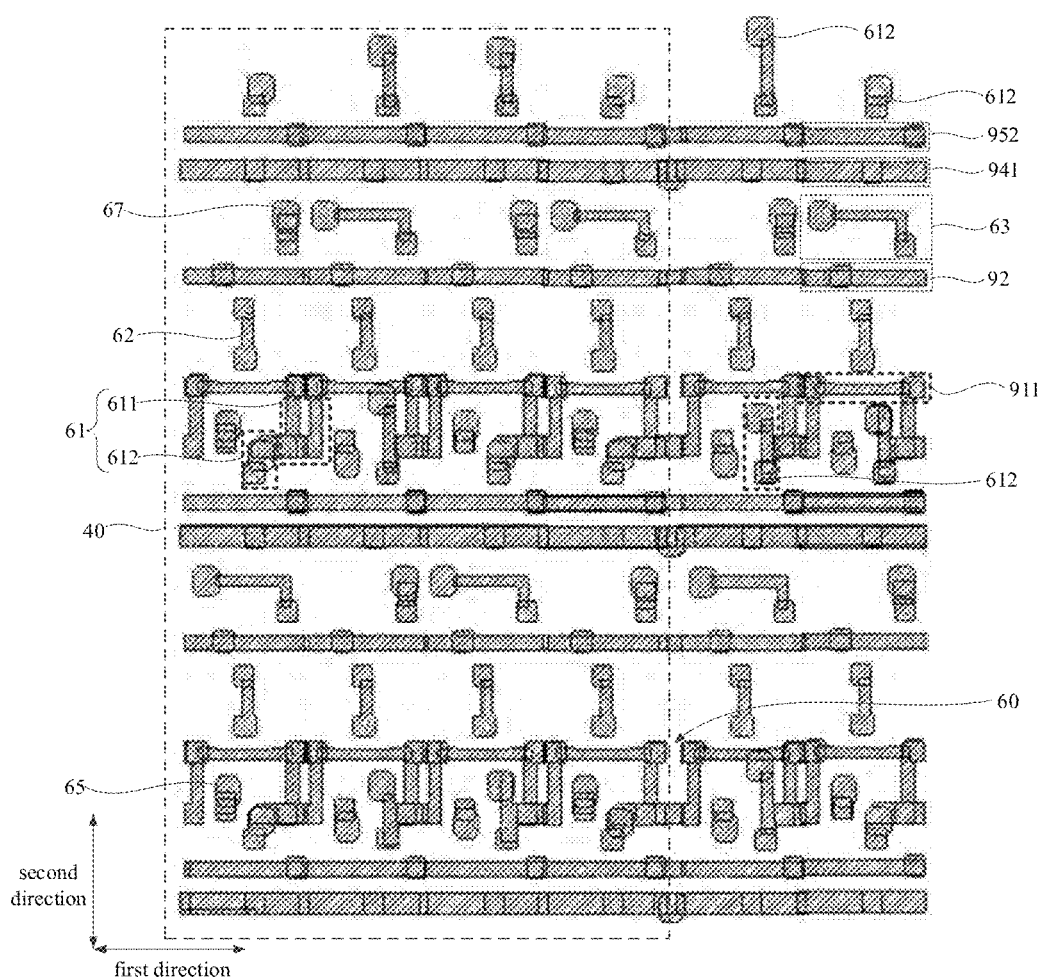
FIG. 14 is a schematic diagram of the first source-drain metal layer in FIG. 8.
Figure 16:
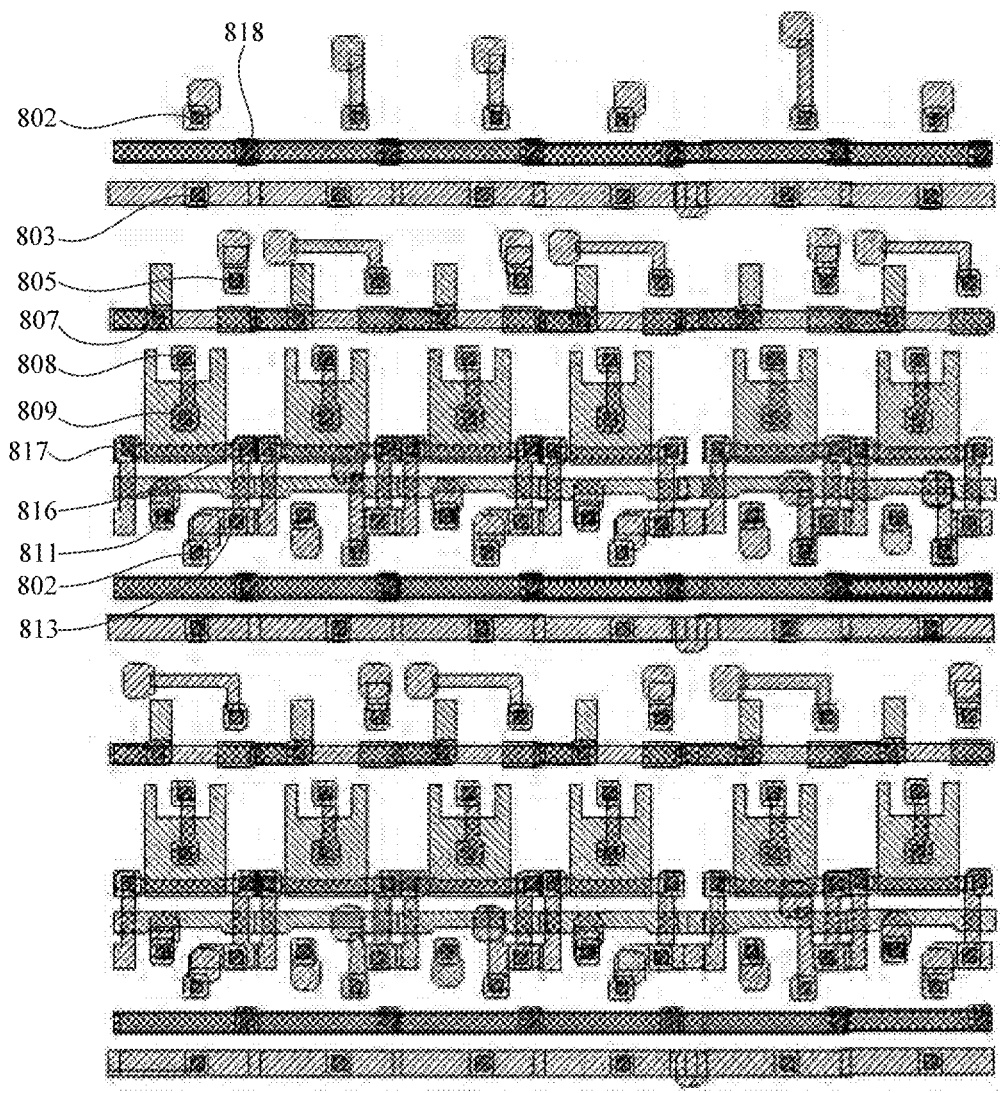
FIG. 16 is a schematic diagram of the first gate metal layer and the first source-drain metal layer in FIG. 8.
Figure 17:
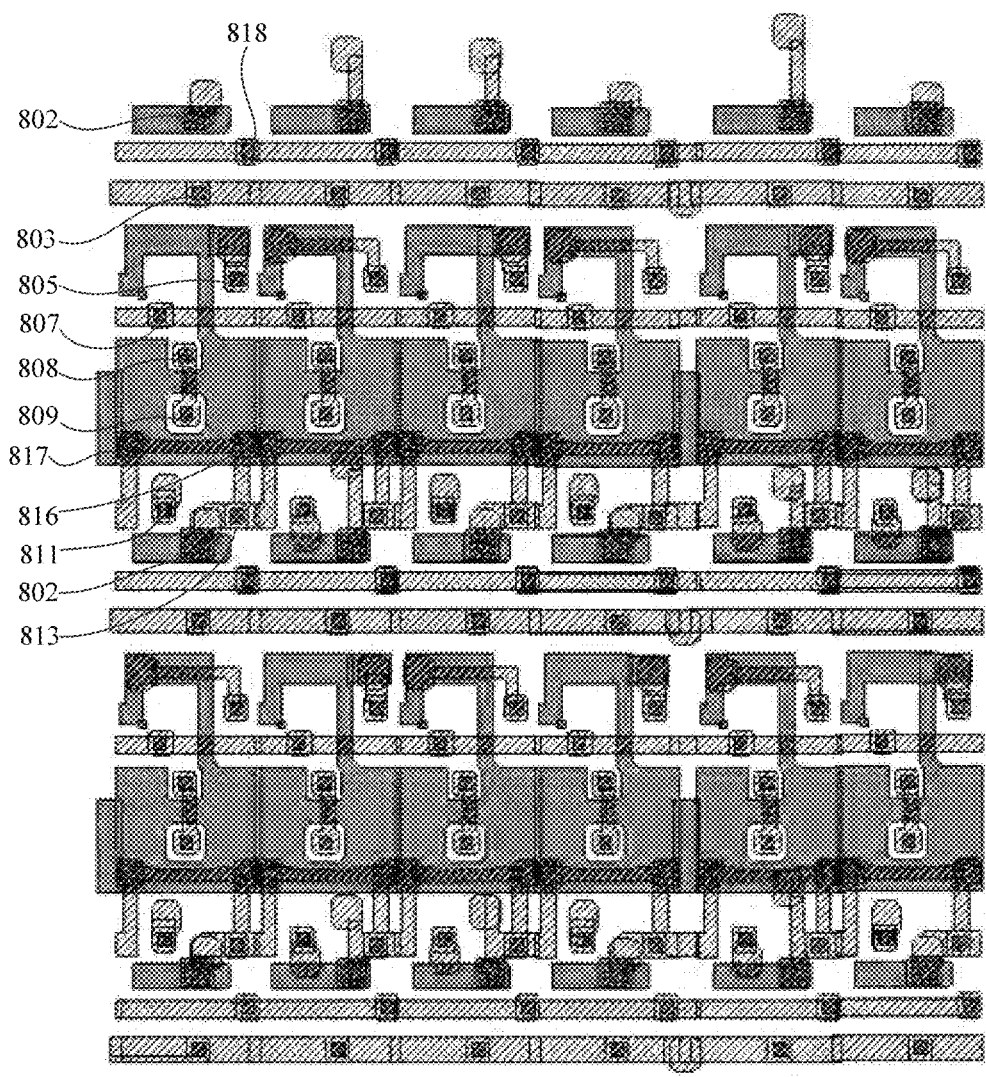
FIG. 17 is a schematic diagram of the second gate metal layer and the first source-drain metal layer in FIG. 8.

As shown in FIG. 12, FIG. 14 and FIG. 16, in some embodiments, the plurality of gate lines includes sub-gate lines 92 corresponding to each sub-pixel; in one sub-pixel, the gate electrode of the compensation transistor (the gate electrode 201g of the first transistor T1) is coupled to the gate electrode of the data writing transistor in an adjacent sub-pixel (that is, the gate electrode 204g of the fourth transistor T4), and the orthographic projection of the gate electrode of the compensation transistor on the substrate of the display substrate overlaps the orthographic projection of the corresponding sub-gate line 92 on the substrate, in the overlapping position, the gate electrode of the compensation transistor is coupled to the corresponding sub-gate line 92 through a via hole.

Exemplarily, the plurality of gate lines are arranged along the second direction, the plurality of gate lines correspond to a plurality of rows of sub-pixels, and each gate line includes a plurality of sub-gate lines 92, and the plurality of sub-gate lines 92 correspond to sub-pixels in the corresponding row of sub-pixels in a one-to-one manner, and the plurality of sub-gate lines 92 are sequentially coupled to form an integral structure.

Exemplarily, the plurality of gate lines are formed in the first source-drain metal layer.

Exemplarily, the gate electrode of the compensation transistor in one sub-pixel and the gate electrode of the data writing transistor in the adjacent sub-pixel are formed as an integral structure.

Exemplarily, the gate electrode of the compensation transistor is formed in the first gate metal layer.

Exemplarily, the orthographic projection of the gate electrode of the compensation transistor on the substrate of the display substrate overlaps the orthographic projection of the corresponding sub-gate line 92 on the substrate, in the overlapping position, the gate electrode of the compensation transistor is coupled to the corresponding sub-gate line 92 through a seventh via hole 807, which penetrates the second gate insulating layer and the interlayer insulating layer.

The above arrangement is beneficial to reduce the resistance of the gate line and improve the stability of the display substrate.

As shown in FIG. 8, FIG. 11 and FIG. 14, in some embodiments, the orthographic projection of the sub-gate line 92 on the substrate of the display substrate at least partially overlaps the orthographic projection of the second electrode of the compensation transistor (that is the second electrode D1 of the first transistor T1) on the substrate.

The above arrangement method shortens the distance between the second electrode of the compensation transistor and the gate electrode of the driving transistor, so that when the second electrode of the compensation transistor is coupled to the gate electrode of the driving transistor, the second conductive connection portion 62 for coupling the second electrode of the compensation transistor and the gate electrode of the driving transistor will not be in short circuit with the gate line.

Figure 13:
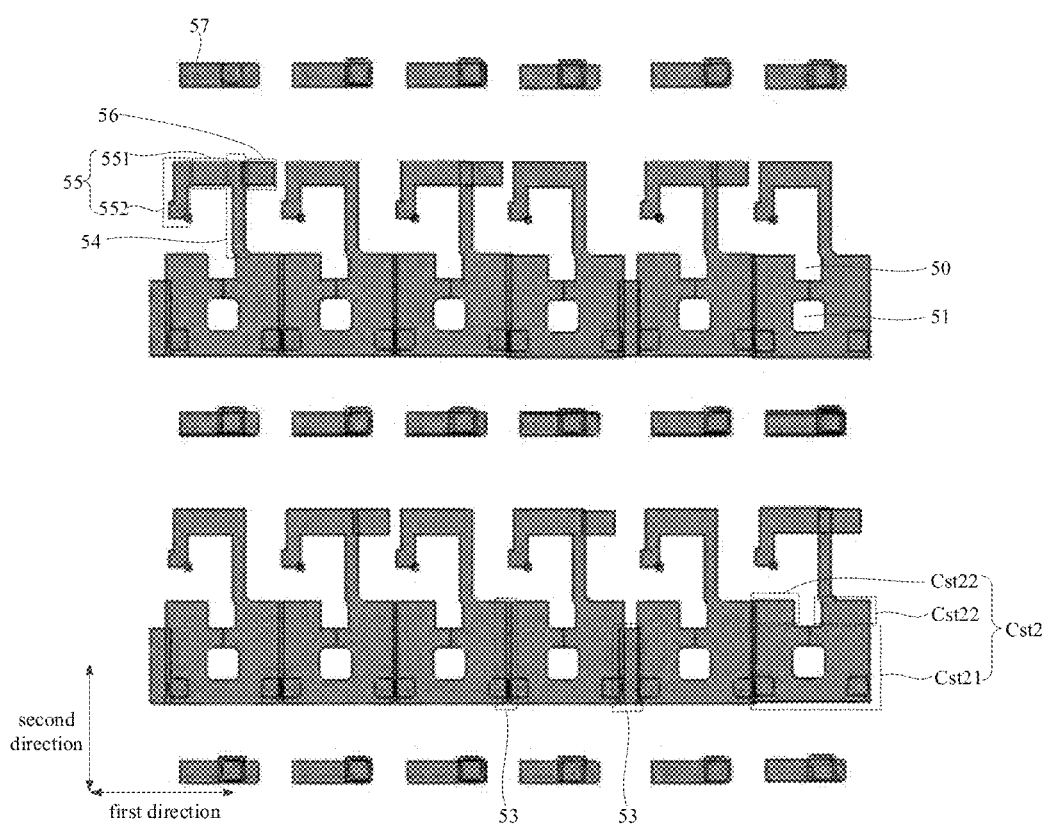
FIG. 13 is a schematic diagram of the second gate metal layer in FIG. 8.

As shown in FIG. 13, in some embodiments, the second electrode plate of the storage capacitor Cst includes a plate main body Cst21 and two plate protrusion portions Cst22, and the plate main body Cst21 is provided with an opening 51, a third spacer region 50 is formed between the two plate protrusion portions Cst22.

Exemplarily, the second electrode plate of the storage capacitor Cst is formed in the second gate metal layer.

Exemplarily, the two plate protrusion portions Cst22 are symmetrically arranged.

Exemplarily, the orthographic projection of the two plate protrusion portions Cst22 on the substrate covers the orthographic projection of the first gate protrusion portion 203g2 and the second gate protrusion portion 203g3 on the substrate.

The orthographic projection of the opening 51 on the substrate at least partially overlaps the orthographic projection of the gate electrode of the driving transistor on the substrate, and the second conductive connection portion 62 can pass through the opening 51 and be coupled to the gate electrode of the driving transistor.

The second electrode plate of the storage capacitor Cst includes a plate main body Cst21 and two plate protrusion portions Cst22, which can not only effectively increase the capacitance of the storage capacitor Cst, but also ensure that other structures in the display substrate have sufficient layout space.

In some embodiments, it is arranged that along the first direction, the second electrode plates in adjacent sub-pixels are coupled together to form a coupling area 53, and along the second direction, the length of the coupling area 53 is greater than or equal to the length of the plate main body Cst21.

Specifically, along the first direction, the second electrode plates located in the same row of sub-pixels are sequentially coupled to form an integral structure.

Exemplarily, in one repeating unit 40, along the second direction, the length of the coupling region 53 is greater than the length of the plate main body Cst21.

Exemplarily, between the repeating units 40 adjacent in the first direction, the length of the coupling region 53 is equal to the length of the plate main body Cst21.

Exemplarily, the orthographic projection of the second electrode plate of the storage capacitor Cst on the substrate at least partially overlaps the orthographic projection of the first sub-data line 981 on the substrate, and the orthographic projection of the second electrode plate on the substrate at least partially overlaps the orthographic projection of the second sub-data line 982 on the substrate.

The above arrangement makes the coupling width of the second electrode plates in the adjacent sub-pixels along the first direction wider, and the second electrode plate is coupled to the power signal line structure 91, thereby effectively reducing the loading of the power signal line structure 91, reducing the power consumption. Moreover, in a direction perpendicular to the substrate, the second electrode plate of the storage capacitor Cst overlaps the first sub-data line 981 and the second sub-data line 982, thereby effectively isolating the influence of first sub-data line 981 and the second sub-data line 982 on the active layer on the bottom of the display substrate.

As shown in FIG. 13, in some embodiments, the sub-pixel further includes a first shielding pattern 54 which is coupled to the second electrode plate of the storage capacitor Cst, and the first shielding pattern 54 is coupled to the second electrode plate of the storage capacitor Cst. At least part of the shielding pattern 54 extends along the second direction.

Exemplarily, the first shielding pattern 54 and the second electrode plate of the storage capacitor Cst are formed as an integral structure.

Exemplarily, the orthographic projection of the first shielding pattern 54 on the substrate overlaps the orthographic projection of the second electrode of the compensation transistor on the substrate.

Exemplarily, the orthographic projection of the first shielding pattern 54 on the substrate overlaps the orthographic projection of the power signal line structure 91 on the substrate.

The first shielding pattern 54 is arranged in the display substrate, so as to better shield the crosstalk of the internal signal of the display substrate.

As shown in FIGS. 4, 9, 11, and 13, in some embodiments, an orthographic projection of the first shielding pattern 54 on the substrate of the display substrate is arranged between the orthographic projection of the second electrode of the compensation transistor (the second electrode D1 of the first transistor T1) on the substrate, and the orthographic projection of the first electrode of the data writing transistor (the first electrode S4 of the fourth transistor T4) on the substrate.

Specifically, the first electrode of the data writing transistor is coupled to the first sub-data line 981 or the second sub-data line 982, and a data signal provided by a sub-data line 981 or the second sub-data line 982 is applied to the first electrode of the data writing transistor.

The above arrangement enables the first shielding pattern 54 to isolate the influence of the data signal on the compensation of the active pattern.

As shown in FIG. 13, in some embodiments, the sub-pixel further includes a second shielding pattern 55, and the second shielding pattern 55 includes a first shielding portion 551 and a second shielding portion 552 that are coupled to each other. The first shielding portion 551 is coupled to the first shielding pattern 54, at least a portion of the first shielding portion 551 extends along the first direction, and at least a portion of the second shielding portion 552 extends along the second direction.

Exemplarily, the second shielding pattern 55 and the first shielding pattern 54 are formed as an integral structure.

Exemplarily, the orthographic projection of the second shielding pattern 55 on the substrate overlaps the orthographic projection of the power signal line structure 91 on the substrate.

The second shielding pattern 55 is arranged in the display substrate, so as to better shield the crosstalk of the internal signal of the display substrate.

As shown in FIG. 3, FIG. 4, FIG. 7, FIG. 11 and FIG. 13, in some embodiments, the compensation active pattern includes: two first semiconductor portions 301, and a second conductor portion 303 coupled to the two first semiconductor portions 301, respectively; the orthographic projection of the second shielding portion 552 on the substrate of the display substrate at least partially overlaps the orthographic projection of the second conductor portion 303 on the substrate.

Exemplarily, the compensation transistor is a double-gate transistor, the compensation transistor includes a compensation active pattern, and the compensation active pattern includes: two first semiconductor portions 301, a second conductor portion 303 coupled to the two first semiconductor portions 301, respectively, a first conductor portion coupled with one first semiconductor portion 301, and a fourth conductor portion coupled with the other first semiconductor portion 301.

The above-mentioned arrangement that the orthographic projection of the second shielding portion 552 on the substrate of the display substrate at least partially overlaps the orthographic projection of the second conductor portion 303 on the substrate, which better ensures the characteristics of the compensation transistor.

As shown in FIGS. 3, 4, 7, 8 and 13, in some embodiments, the orthographic projection of the second shielding portion 552 on the substrate of the display substrate overlaps the orthographic projections of the first sub-data lines 981 on the substrate.

As shown in FIGS. 3, 4, 7, 8 and 13, in some embodiments, at least part of the sub-pixels further includes a third shielding pattern 56, which is coupled to the first shielding pattern 54; in some of the sub-pixels, the orthographic projection of the third shielding pattern 56 on the substrate of the display substrate overlaps the orthographic projection of the second sub-data line 982 on the substrate.

Exemplarily, in each sub-pixel in the display substrate, the orthographic projection of the second shielding portion 552 on the substrate of the display substrate overlaps the orthographic projection of the first sub-data line 981 on the substrate. In the sub-pixel in the display substrate to which a data signal is applied by the second sub-data line 982 include the third shielding pattern 56.

Exemplarily, the orthographic projection of the third shielding pattern 56 on the substrate is located at the periphery of an end of the first electrode of the data writing transistor to which the data signal is applied.

Exemplarily, the orthographic projection of part of the second shielding pattern 55 on the substrate overlaps the orthographic projection of the third conductive connecting portion 63 on the substrate.

The above arrangement ensures that in at least part of the sub-pixels, the location blocking conditions for receiving the data signal near the data writing transistor are consistent, thereby ensuring that the capacitance of the location of receiving the data signal in at least part of the sub-pixels is consistent, and ensuring the uniformity of the loading of the sub-data line in the at least part of sub-pixels used to provide the data signal at the location.

As shown in FIGS. 3, 4, 7, 8 and 13, in some embodiments, in at least part of the sub-pixels, the third shielding pattern 56 is located on the first side of the first shielding pattern 54, the second shielding pattern 55 is located on the second side of the first shielding pattern 54, and along the first direction, the first side is opposite to the second side.

As shown in FIG. 3, FIG. 5, FIG. 7, FIG. 10, FIG. 11, FIG. 13, and FIG. 14, in some embodiments, the sub-pixel further includes: a reset transistor, the first electrode of the reset transistor is coupled to the initialization signal line structure 94, and the second electrode of the reset transistor is coupled to the gate electrode of the driving transistor, wherein the reset transistor includes a reset active pattern, the reset active pattern includes two second semiconductor portions 304, and a third conductor portion 305 respectively coupled to the two second semiconductor portions 304; and a fourth shielding pattern 57, the fourth shielding pattern 57 is coupled to the power signal line structure 91, the orthographic projection of the fourth shielding pattern 57 on the substrate of the display substrate at least partially overlaps the orthographic projection of the third conductor portion 305 on the substrate.

Specifically, the reset transistor has a double-gate structure, the first electrode of the reset transistor is coupled to the sub-initialization signal line 941 corresponding to a sub-pixel to which the reset transistor belongs, and the second electrode of the reset transistor is coupled to the gate electrode of the driving transistor through the second electrode of the compensation transistor, and the first reset pattern 951 in the sub-reset signal line 95 corresponding to the sub-pixel is multiplexed as the gate electrode of the reset transistor.

The reset transistor includes a reset active pattern, and the reset active pattern includes two second semiconductor portions 304, a third conductor portion 305 respectively coupled to the two second semiconductor portions 304, a fifth conductor portion coupled to one of the two semiconductor portions 304, and a sixth conductor portion coupled to the other of the two second semiconductor portions 304, the fifth conductor portion serves as the first electrode of the reset transistor and the sixth conductor portion serves as the second electrode of the reset transistor.

Exemplarily, the fourth shielding pattern 57 is formed in the second gate metal layer.

Exemplarily, the fourth shielding pattern 57 is coupled to the corresponding second sub-power supply line 912 in the power signal line structure 91.

Exemplarily, the sub-pixel further includes a first sub-connecting portion 612, the fourth shielding pattern 57 is coupled to the first sub-connecting portion 612 through a second via hole 802, and the first sub-connecting portion 612 is coupled to the power signal line structure 91 through the first via hole 801.

Exemplarily, the first sub-connection portion 612 is formed in the first source-drain metal layer. The second via hole 802 penetrates the interlayer insulating layer, and the first via hole 801 penetrates the first planarization layer.

The above-mentioned arrangement that the orthographic projection of the fourth shielding pattern 57 on the substrate of the display substrate at least partially overlaps the orthographic projection of the third conductor portion 305 on the substrate, which better ensures the characteristics of the reset transistor.

As shown in FIGS. 3 and 13, in some embodiments, the plurality of first initialization signal lines includes sub-initialization signal lines 941 corresponding to each sub-pixel; in at least some of the sub-pixels, the orthographic projection of the sub-reset signal line 95 on the substrate of the display substrate is located between the orthographic projection of the sub-initialization signal line 941 on the substrate and the orthographic projection of the fourth shielding portion on the substrate.

The above arrangement method can make better use of the layout space of the display substrate and reduce the layout difficulty of the display substrate.

As shown in FIG. 5, FIG. 13, FIG. 14, FIG. 15, and FIG. 17, in some embodiments, the power signal line structure 91 includes: a first sub-power supply line 911 corresponding to each sub-pixel and a second sub-power supply line 912 corresponding to each sub-pixel, at least part of the first sub-power supply line 911 extends along the first direction, and at least part of the second sub-power supply line 912 extends along the second direction; in one sub-pixel, the first sub-power supply line 911 is coupled to the second sub-power supply line 912, and the first sub-power supply line 911 is coupled to the second electrode plate Cst2 of the storage capacitor Cst.

Exemplarily, in the same column of sub-pixels, the second sub-power supply lines 912 corresponding to each sub-pixel are sequentially coupled to form an integral structure.

Exemplarily, the first sub-power supply line 911 is coupled to the second electrode plate of the storage capacitor Cst in the sub-pixel to which the first sub-power supply line 911 belongs.

Exemplarily, the orthographic projection of the first sub-power supply line 911 on the substrate and the orthographic projection of the second electrode plate of the storage capacitor Cst in the sub-pixel on the substrate have an overlapping area, the first sub-power supply line 911 is coupled to the second electrode plate of the storage capacitor Cst through the sixteenth via hole 816 and the seventeenth via hole 817 provided in the overlapping area.

Exemplarily, the sixteenth via hole 816 and the seventeenth via hole 817 penetrate the interlayer insulating layer.

Exemplarily, the sixteenth via hole 816 is coupled to one end of the first sub-power supply line 911, and the seventeenth via hole 817 is coupled to the other end of the first sub-power supply line 911.

Exemplarily, the first sub-power supply line 911 is formed in the first source-drain metal layer.

Exemplarily, the second sub power supply line 912 is formed in the second source-drain metal layer.

The above-mentioned arrangement that the power signal line structure 91 includes the first sub-power supply line 911 and the second sub-power supply line 912, so that the power signal line is formed into a grid structure, thereby reducing the resistance of the power supply line structure and reducing the loading generated on the power supply line structure.

As shown in FIGS. 14 and 18, in some embodiments, in the same repeating unit 40, the first sub-power supply lines 911 located in the same row along the first direction are sequentially coupled, and in the adjacent repeating unit 40, there is a fourth spacer region 60 between the two first sub-power supply lines 911 closest to each other in the first direction.

Exemplarily, in the same repeating unit 40, the first sub-power supply lines 911 located in the same row along the first direction are sequentially coupled to form an integral structure.

In some embodiments, the orthographic projection of the compensation initialization signal line 942 on the substrate at least partially overlaps the orthographic projection of the fourth spacer region 60 on the substrate.

The above arrangement method effectively reduces the overlapping area of the compensation initialization signal line 942 and the first source-drain metal layer, reduces the parasitic capacitance in the display substrate, and improves the stability of the display substrate.

Figure 15:
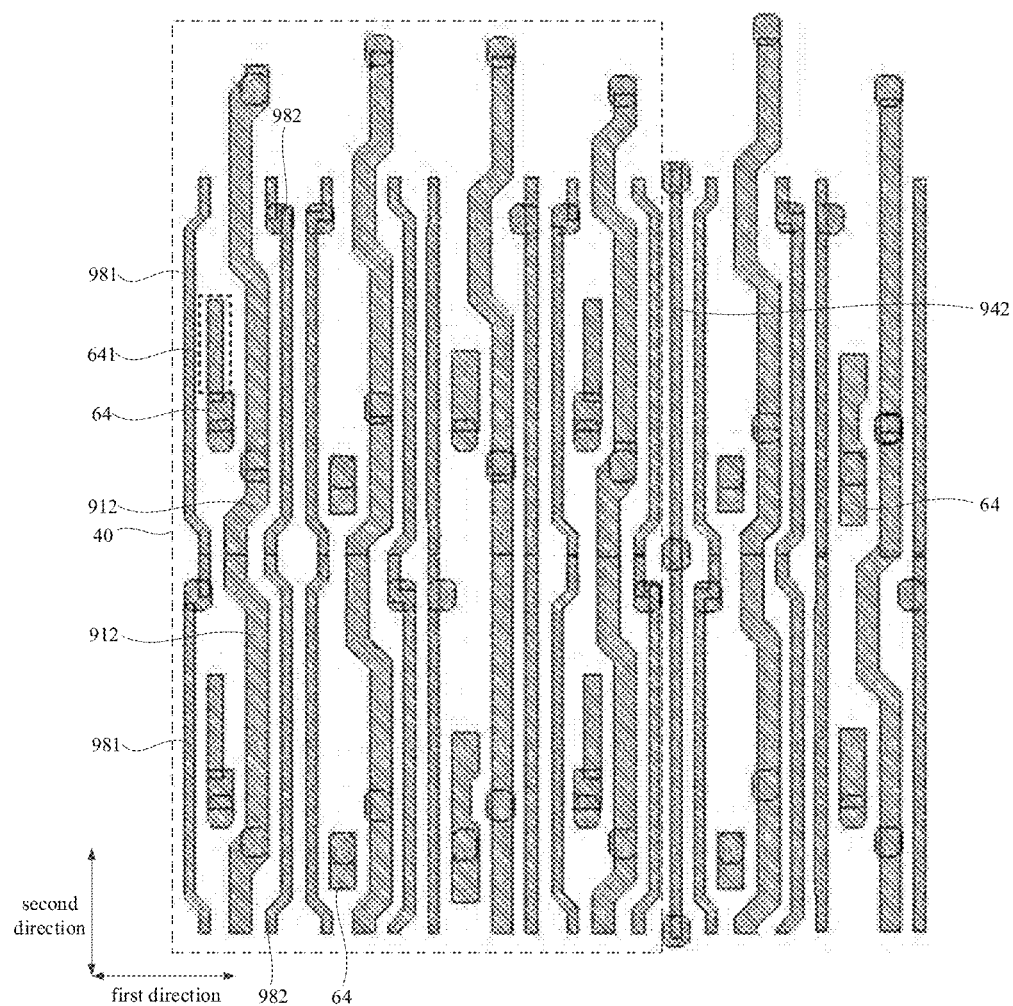
FIG. 15 is a schematic diagram of the second source-drain metal layer in FIG. 8.

As shown in FIG. 14, FIG. 15, and FIG. 18, in some embodiments, the sub-pixel further includes a first conductive connection portion 61; in the same sub-pixel, the first sub-power supply line 911 is coupled to the first conductive connection portion 61, the orthographic projection of the first conductive connection portion 61 on the substrate at least partially overlaps the orthographic projection of the second sub-power supply line 912 on the substrate, and the first conductive connection portion 61 is coupled to the second sub-power supply line 912 through the via hole at the overlapping position.

Exemplarily, the first sub-power supply line 911 and the first conductive connection portion 61 are formed as an integral structure.

Exemplarily, the first conductive connection portion 61 is coupled to the second sub-power supply line 912 through a first via hole 801 at the overlapping position, and the first via hole 801 penetrates the first planarization layer.

The above arrangement method can make better use of the layout space of the display substrate and reduce the layout difficulty of the display substrate.

As shown in FIG. 14, in some embodiments, the first conductive connection portion 61 includes: U-shaped sub-connecting portion 611, one end of the U-shaped sub-connecting portion 611 is coupled to the first sub-power supply line 911 in the sub-pixel to which the U-shaped sub-connecting portion 611 belongs, and the other end of the U-shaped sub-connecting portion 611 is connected to the first sub-power supply line 911 in the adjacent sub-pixel; a first sub-connection portion 612 coupled to the U-shaped sub-connection portion 611, the orthographic projection of the first sub-connection portion 612 on the substrate of the display substrate overlaps the orthographic projection of the second sub-power supply line 912 on the substrate, and the first sub-connecting portion 612 and the second sub-power supply line 912 are coupled through a via hole provided at the overlapping position.

Exemplarily, the U-shaped sub-connecting portion 611 and the first sub-connecting portion 612 are formed as an integral structure.

Exemplarily, one end of the U-shaped sub-connecting portion 611 is coupled to the second end of the first sub-power supply line 911 in the sub-pixel to which it belongs, and the other end of the U-shaped sub-connecting portion 611 is coupled to the first end of the first sub-power supply line 911 in the adjacent sub-pixel. The second end is close to the first end.

Exemplarily, at least part of the first sub-connecting portion 612 extends along the second direction.

The length of the first sub-connection portion 612 in the second direction can be set according to actual needs. For example, the length of the first sub-connection portion 612 in the second direction in different sub-pixels can be different.

The above arrangement method can not only make better use of the layout space of the display substrate and reduce the layout difficulty of the display substrate; but also reduce the overlapping area between the first conductive connection portion 61 and the data line.

Figure 6:
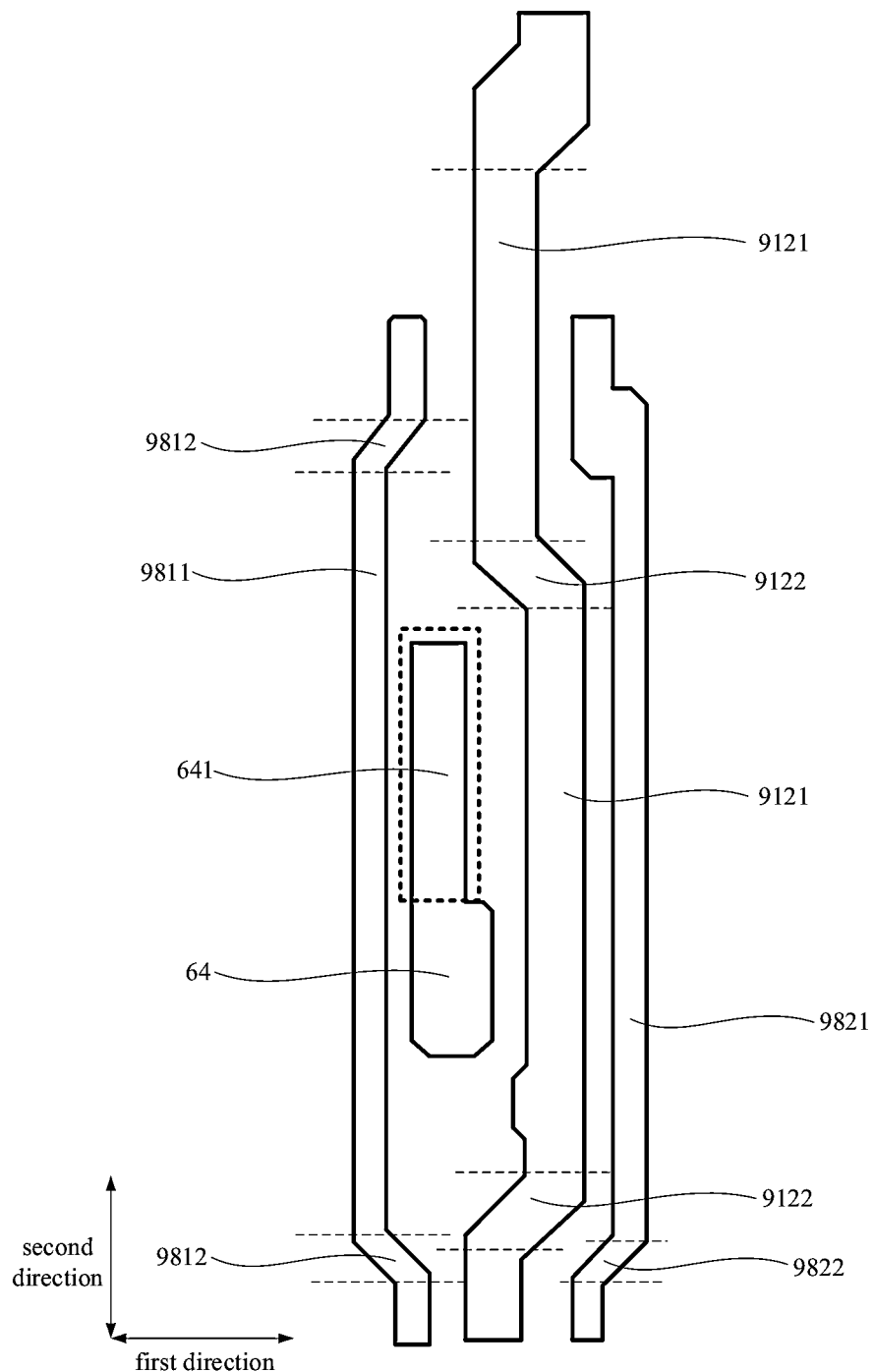
FIG. 6 is a schematic diagram of the second source-drain metal layer in FIG. 3.

As shown in FIG. 6 and FIG. 15, in some embodiments, at least part of the second sub-power supply line 912 includes a power supply straight side portion 9121 and a power supply bending portion 9122. At least a portion of the power supply straight side portion 9121 extends along the second direction, there is an angle between the power supply bending portion 9122 and the power supply straight side portion 9121; for example, the angle a satisfies: $90°≤a<180°$.

In the above arrangement, at least part of the second sub-power supply line 912 includes the power supply straight side portion 9121 and the power supply bending portion 9122, which is beneficial to reduce the overall resistance of the power signal line structure 91.

As shown in FIG. 5, FIG. 13, FIG. 14 and FIG. 16, in some embodiments, the sub-pixel further includes a second conductive connection portion 62, and at least part of the second conductive connection portion 62 extends along the second direction; the first end of the second conductive connection portion 62 is coupled to the gate electrode of the driving transistor, and the second end of the second conductive connection portion 62 is coupled to the second electrode of the compensation transistor, the orthographic projection of the second end on the substrate at least partially overlaps the orthographic projection of the third spacer region 50 on the substrate.

Exemplarily, the second conductive connection portion 62 is formed in the first source-drain metal layer.

Exemplarily, the orthographic projection of the first end of the second conductive connecting portion 62 on the substrate and the orthographic projection of the gate electrode of the driving transistor on the substrate have an overlapping area, and the first end of the second conductive connecting portion 62 is coupled to the gate electrode of the driving transistor through a ninth via hole 809 provided in the overlapping area; the orthographic projection of the second end of the second conductive connecting portion 62 on the substrate and the orthographic projection of the second electrode of the compensation transistor on the substrate have an overlapping area, and the second end of the second conductive connection portion 62 is coupled to the second electrode of the compensation transistor through an eighth via hole 808 arranged in the overlapping area.

Exemplarily, the eighth via hole 808 penetrates the first gate insulating layer, the second gate insulating layer and the interlayer insulating layer; the ninth via hole 809 penetrates the second gate insulating layer and interlayer insulation layer.

The orthographic projection of the second end of the second conductive connection portion 62 on the substrate at least partially overlaps the orthographic projection of the third spacer region 50 on the substrate, so that the distance between the second end of the second conductive connection portion 62 and the sub-gate line 92 corresponding to the sub-pixel to which it belongs is relatively far away, thereby reducing the risk of a short circuit between the second conductive connection portion 62 and the sub-gate line 92. Moreover, the above-mentioned arrangement method makes better use of the layout space of the display substrate and reduces the difficulty of layout of the display substrate.

As shown in FIG. 14, in some embodiments, the orthographic projection of the second conductive connecting portion 62 on the substrate does not overlap the orthographic projection of the gate line on the substrate.

The above arrangement makes it possible to avoid short circuit between the second conductive connection portion 62 and the sub-gate line 92 when the second conductive connection portion 62 and the sub-gate line 92 are arranged in the same layer and made of the same material.

As shown in FIG. 7 and FIG. 14, in some embodiments, some of the sub-pixels further include: a third conductive connection portion 63, at least part of the third conductive connection portion 63 extends along the first direction, in one sub-pixel, the first end of the third conductive connection portion 63 is coupled to the first sub-data line 981, and the second end of the third conductive connection portion 63 is coupled to the first electrode of the data writing transistor.

Exemplarily, the third conductive connecting portion 63 is formed in a structure similar to a "¬" shape.

Exemplarily, the orthographic projection of the first end of the third conductive connecting portion 63 on the substrate and the orthographic projection of the first sub-data line 981 on the substrate have an overlapping area. The first end of the third conductive connecting portion 63 is coupled to the first sub-data line 981 through a nineteenth via hole 819 provided in the overlapping area, and the nineteenth via hole 819 penetrates the first planarization layer; the orthographic projection of the second end of the third conductive connection portion 63 on the substrate and the orthographic projection of the first electrode of the data writing transistor on the substrate have an overlapping area, the second end of the third conductive connecting portion 63 is coupled to the first electrode of the data writing transistor through a fifth via hole 805 provided in the overlapping area, and the fifth via hole 805 penetrates the first gate insulating layer, the second gate insulating layer and the interlayer insulating layer.

Exemplarily, the orthographic projection of the third conductive connecting portion 63 on the substrate at least partially overlaps the orthographic projection of the second shielding pattern 55 on the substrate.

Figure 5:
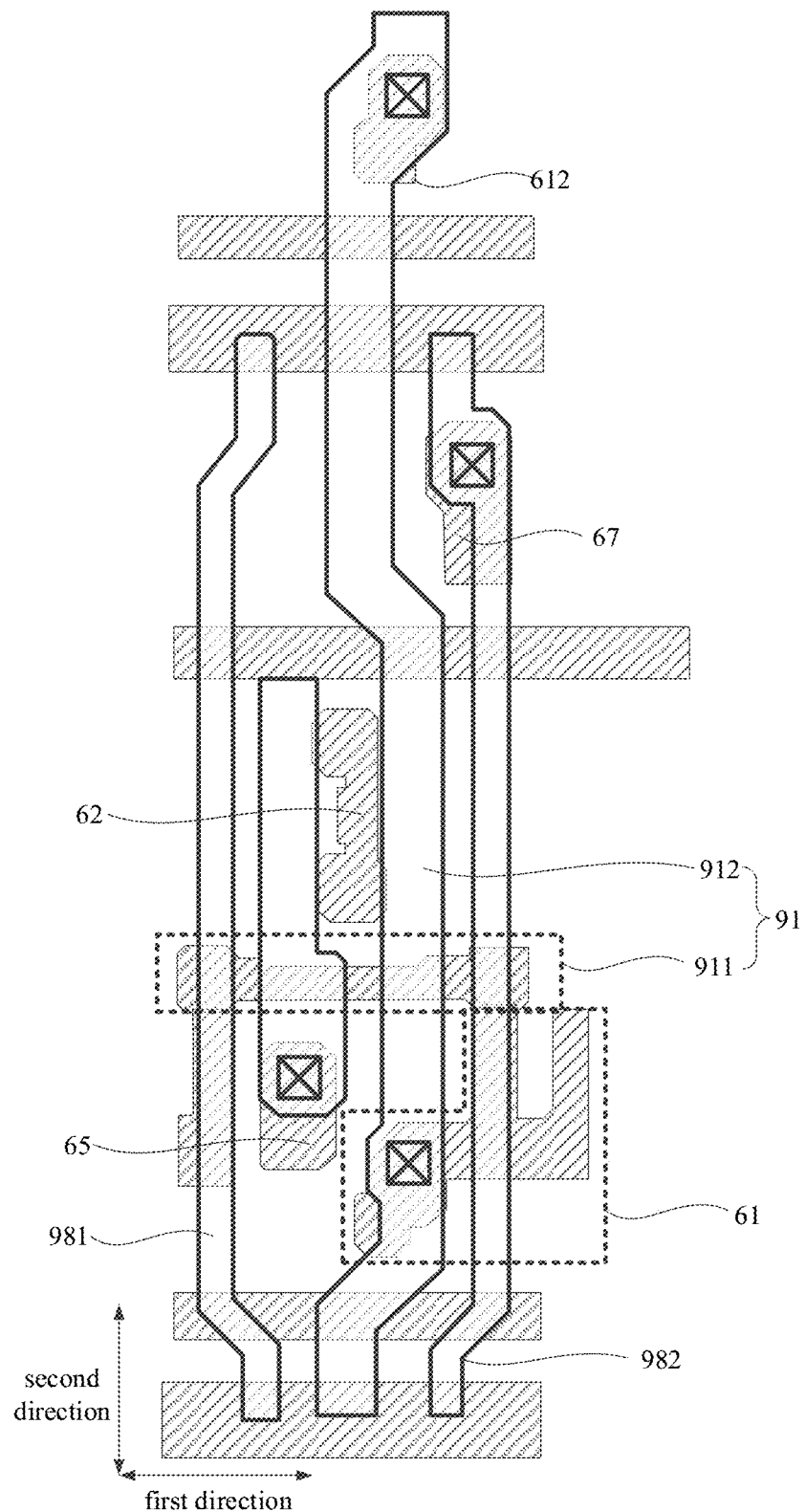
FIG. 5 is a schematic diagram of the first source-drain metal layer and the second source-drain metal layer in FIG. 3.

As shown in FIGS. 3 and 5, in some embodiments, some of the sub-pixels further include a seventh conductive connection portion 67. The orthographic projection of the seventh conductive connection portion 67 on the substrate at least partially overlaps the orthographic projections of the third shielding pattern 56 on the substrate.

Exemplarily, the seventh conductive connection portion 67 is formed in the first source-drain metal layer.

Exemplarily, the orthographic projection of the first end of the seventh conductive connecting portion 67 on the substrate and the orthographic projection of the second sub-data line 982 on the substrate have an overlapping area. The first end of the seventh conductive connecting portion 67 and the second sub-data line 982 are coupled through a fourth via hole 804 provided in the overlapping area, and the fourth via hole 804 penetrates the first planarization layer. The orthographic projection of the second end of the seventh conductive connecting portion 67 on the substrate and the orthographic projection of the first electrode of the data writing transistor on the substrate have an overlapping area, and the second end of the seventh conductive connecting portion 67 and the first electrode of the data writing transistor are coupled to each other through a fifth via hole 805 provided in the overlapping area, and the fifth via hole 805 penetrates the first gate insulation layer, the second gate insulating layer and the interlayer insulating layer.

The above arrangement ensures that in at least some of the sub-pixels, the location blocking conditions for receiving the data signal near the data writing transistor are consistent, thereby ensuring that the capacitance of the location of receiving the data signal in at least some of the sub-pixels is consistent, and ensuring the uniformity of the loading of the sub-data line in at least some of the sub-pixels used to provide the data signal at this location.

As shown in FIG. 6, in some embodiments, at least part of the first sub-data line 981 includes a first straight side portion 9811 and a first bending portion 9812, and the first straight side portion 9811 extends along the second direction, there is an angle between the first bending portion 9812 and the first straight side portion 9811; at least part of the second sub-data line 982 includes a second straight side portion 9821 and a second bending portion 9822, the second straight side portion 9821 extends along the second direction, and an angle is formed between the second bending portion 9822 and the second straight side portion 9821. Exemplarily, the angle a satisfies: $90°≤a<180°$.

The above arrangement is beneficial to reduce the resistance of the first sub-data line 981 and the second sub-data line 982.

As shown in FIG. 3, FIG. 5, FIG. 7 and FIG. 14, in some embodiments, the display substrate further includes: an insulating layer located between the third conductive connecting portion 63 and the first sub-data line 981, a via hole is provided on the insulating layer, and the third conductive connection portion 63 is coupled to the first sub-data line 981 through the via hole; the orthographic projection of the via hole on the substrate at least partially overlaps the orthographic projection of the first bending portion 9812 on the substrate.

Exemplarily, the insulating layer includes a first planarization layer.

Exemplarily, in some of the sub-pixels, the third conductive connection portion 63 is coupled to the first sub-data line 981 through the nineteenth via hole 819, and the orthographic projection of the nineteenth via hole 819 on the substrate at least partially overlaps the orthographic projection of the first bending portion 9812 on the substrate.

Exemplarily, in some of the sub-pixels, the seventh conductive connection portion 67 is coupled to the first sub-data line 981 through the fourth via hole 804, and the orthographic projection of the fourth via hole 804 on the substrate at least partially overlaps the orthographic projection of the second bending portion 9822 on the substrate.

Exemplarily, in the first direction, the width of the first bending portion 9812 is greater than the width of the first straight side portion 9811, and the width of the second bending portion 9822 is greater than the width of the second straight side portion 9821.

The above arrangement is more conducive to the reliability of the display substrate.

Figure 19:
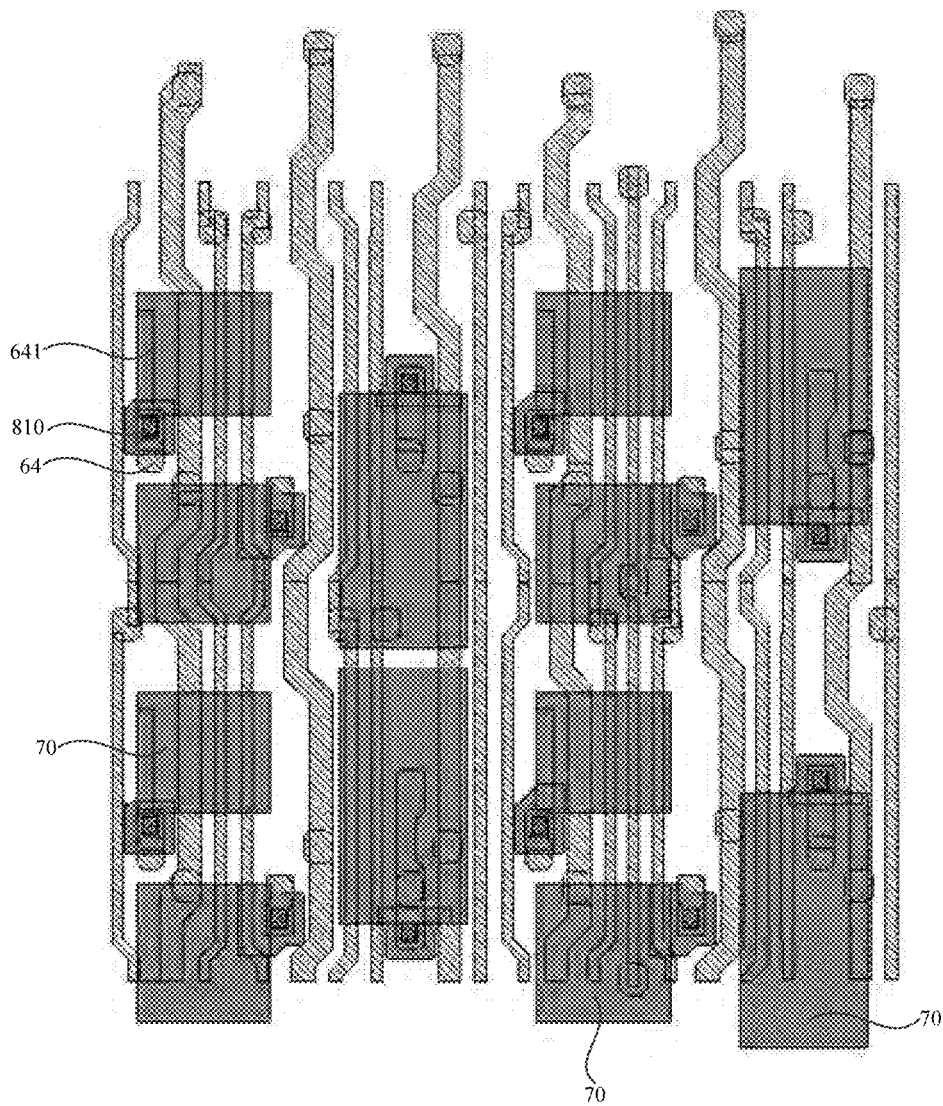
FIG. 19 is a schematic diagram of a second source-drain metal layer and an anode layer provided by an embodiment of the present disclosure.

As shown in FIGS. 6, 14 and 19, in some embodiments, the sub-pixel further includes an anode pattern 70 and a fourth conductive connection portion 64. In one sub-pixel, the sub-pixel driving circuit is coupled to the corresponding anode pattern 70 through the fourth conductive connection portion 64; at least part of the fourth conductive connection portion 64 includes an extension portion 641 extending along the second direction, and the orthographic projection of the extension portion 641 on the substrate of the display substrate at least partially overlaps the orthographic projection of the anode pattern 70 connected to the extension portion 641 on the substrate.

Exemplarily, the fourth conductive connecting portion 64 is formed in the second source-drain metal layer.

Exemplarily, the sub-pixel further includes a fifth conductive connection portion 65, and the sub-pixel driving circuit is coupled to the corresponding anode pattern 70 sequentially through the eleventh via hole 811, the fifth conductive connection portion 65, the twentieth via hole 820, and the fourth conductive connection portion 64 and the tenth via hole 810. The eleventh via hole 811 penetrates the first gate insulating layer, the second gate insulating layer and the interlayer insulating layer. The twentieth via 820 penetrates the first planarization layer. The tenth via hole 810 penetrates the second planarization layer.

Exemplarily, the fifth conductive connecting portion 65 is formed in the first source-drain metal layer.

The orthographic projection of the extension portion 641 on the substrate of the display substrate at least partially overlaps the orthographic projection of the anode pattern 70 connected to it on the substrate, which is more conducive to the flatness of the anode pattern 70. Therefore, the color shift phenomenon of the display substrate is effectively improved.

As shown in FIG. 15, in some embodiments, the sub-pixels include a plurality of first sub-pixels, a plurality of second sub-pixels, and a plurality of third sub-pixels.

The fourth conductive connection portion 64 in the first sub-pixel has a first length in the second direction, and the fourth conductive connection portion 64 in the second sub-pixel has a second length in the second direction, the fourth conductive connection portion 64 in the third sub-pixel has a third length in the second direction; the first length is greater than the second length, and the third length is greater than the third length.

Exemplarily, the first sub-pixel includes a red sub-pixel, the second sub-pixel includes a green sub-pixel, and the third sub-pixel includes a blue sub-pixel.

Exemplarily, the first length is greater than the third length.

Exemplarily, the third length is greater than the first length.

The embodiments of the present disclosure also provide a display device, which includes the display substrate provided in the above-mentioned embodiments.

In the display substrate provided by the above-mentioned embodiment, the reset signal line includes a sub-reset signal line 95 corresponding to each of the sub-pixels, and each of the sub-reset signal lines 95 includes a first reset pattern 951 and the second reset pattern 952 coupled to each other, so that the reset signal line can still have a lower resistance even when the reset signal line has a longer length, thereby greatly improving the delay effect of the reset signal line when the reset signal is transmitted, and improving the stability of the display substrate.

Since the display device provided by the embodiment of the present disclosure includes the above-mentioned display substrate, it has all the beneficial effects of the above-mentioned display substrate, and will not be repeated here.

It should be noted that the display device may be any product or component with a display function, such as a TV, a monitor, a digital photo frame, a mobile phone, a tablet computer, and so on.

In some embodiments, the plurality of data lines in the display substrate include a plurality of first data lines and a plurality of second data lines, the plurality of data lines are divided into a plurality of data line groups, and each data line group includes a first data line and a second data line.

The display device further includes: a driver chip, the driver chip including a plurality of data signal output pins; a plurality of multiplexers, the input ends of the plurality of multiplexers are coupled to the plurality of data signal output pins in a one-to-one manner; the plurality of multiplexers correspond to the plurality of data line groups in a one-to-one manner, the first output end of the multiplexer is coupled to the first data line in the corresponding data line group, and the second output end of the multiplexer is coupled to the second data line in the corresponding data line group.

Exemplarily, a plurality of data line groups correspond to a plurality of columns of sub-pixels in a one-to-one manner.

Figure 1:
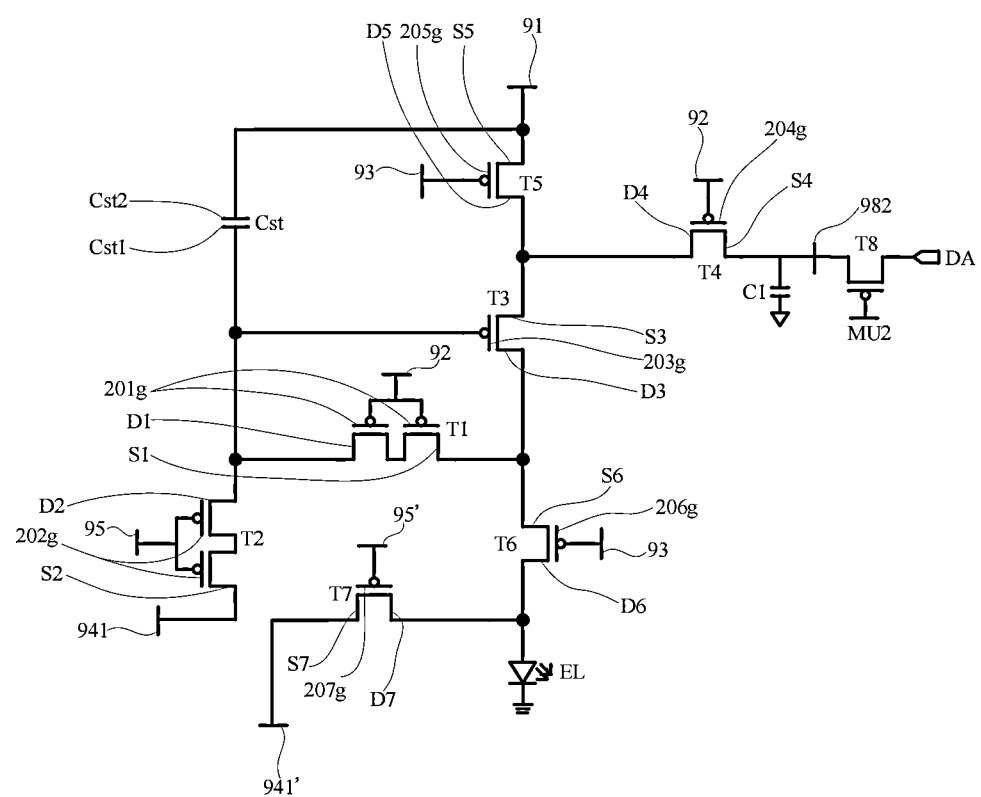
FIG. 1 is a circuit diagram of a sub-pixel driving circuit provided by an embodiment of the disclosure.

Exemplarily, as shown in FIG. 1, each of the multiplexers includes a first multiplexing transistor and a second multiplexing transistor T8, and the input terminal of the first multiplexing transistor and the input terminal of the second multiplexing transistor T8 is coupled to the corresponding data signal output pin, and the output terminal of the first multiplexing transistor is the first output terminal for coupling with the corresponding first data line. The output terminal of the second multiplexing transistor is the second output terminal for coupling with the corresponding second data line.

Exemplarily, the control terminal of the first multiplexing transistor and the control terminal of the second multiplexing transistor receive different control signals.

Exemplarily, the time when the control signal received by the control terminal of the first multiplexing transistor is at a valid level may partially overlap the time when the control signal received by the control terminal of the second multiplexing transistor is at the valid level.

The display device provided by the above embodiments can ensure that each sub-pixel has sufficient data signal writing time, thereby solving the problem of insufficient data signal writing time of each row of sub-pixels when the display substrate is displaying at high frequency.

The embodiments of the present disclosure also provide a method for driving a display substrate, which is used to drive the display substrate provided in the above-mentioned embodiments, and the display substrate includes: a plurality of sub-pixels; a plurality of reset signal lines, at least part of the reset signal lines extend along a first direction; the plurality of reset signal lines include a sub-reset signal line 95 corresponding to each of the sub-pixels, and the sub-reset signal line 95 includes a first reset pattern 951 and a second reset pattern 952 coupled to each other, the first reset pattern 951 is located between a substrate of the display substrate and the second reset pattern 952; a plurality of gate lines, at least part of the gate lines extend along the first direction; a plurality of light emitting control signal lines, at least part of the light emitting control signal lines extend along the first direction; a plurality of data lines, at least part of the data lines extend along a second direction, the first direction intersects the second direction, the plurality of data lines includes a plurality of first data lines and a plurality of second data, the plurality of data lines are divided into a plurality of data line groups, and each data line group includes a first data line and a second data line; the plurality of data line groups are arranged along the first direction; a power signal line structure 91, at least part of the power signal line structure 91 extends along the second direction; and initialization signal line structure 94, at least part of the initialization signal line structure 94 extends along the second direction.

The driving method includes: scanning a plurality of gate lines row by row, when scanning the Nth gate line, a data signal is written into a first data line of the plurality of data lines, and when scanning the (N+1)th gate line, a data signal is written into a second data line of the plurality of data lines, the time for scanning the Nth gate line and the time for scanning the (N+1)th gate line at least partially overlap, and N is an odd or even number.

When the time for scanning the Nth gate line overlaps the time for scanning the (N+1)th gate line, in a row of sub-pixels corresponding to the Nth gate line, the sub-data line corresponding to each sub-pixel is disconnected from the data signal output pin of the driver chip, the disconnection operation can be controlled by the multiplexer. At the same time, in the row of sub-pixels corresponding to the Nth gate line, each sub-pixel continues to be charged by parasitic capacitor C1 generated by the corresponding sub-data line.

It should be noted that one end of the parasitic capacitor C1 shown in FIG. 1 is coupled to the second sub-data line, and the other end is connected to various signals, such as a positive power signal, a negative power signal, and various scanning signals.

The driving method provided by the foregoing embodiments can ensure that each sub-pixel has sufficient data signal writing time, thereby solving the problem of insufficient data signal writing time of each row of sub-pixels when the display substrate is displaying at a high frequency.

In the display substrate provided by the foregoing embodiment, the plurality of sub-pixels can be divided into a plurality of rows of sub-pixels sequentially arranged along the second direction, and a plurality of columns of sub-pixels sequentially arranged along the first direction.

As shown in FIG. 3, FIG. 7, FIG. 8, FIG. 11, FIG. 14 and FIG. 15, the sub-initialization signal lines 941 included in the same row of sub-pixels are sequentially coupled to form a first initialization signal line of an integral structure. The sub-gate lines 92 included in the same row of sub-pixels are sequentially coupled to form a gate line of an integral structure. The sub-light emitting control signal lines 93 included in the same row of sub-pixels are sequentially coupled to form the light emitting control signal line of an integral structure. The first reset patterns 951 included in the same row of sub-pixels are sequentially coupled to form an integral structure; the second reset patterns 952 included in the same row of sub-pixels are sequentially coupled to form an integral structure; the first reset pattern 951 and the second reset pattern 952 in each sub-pixel are coupled through an eighteenth via hole 818 to form the sub-reset signal line 95. The first sub-power supply lines 911 included in the same row of sub-pixels are sequentially coupled to form a first power supply line with an integral structure.

The second sub-power supply lines 912 included in the same column of sub-pixels are sequentially coupled to form a second power supply line with an integral structure. The first sub-data lines 981 included in same column of the sub-pixels are sequentially coupled to form an integral structure; the second sub-data lines 982 included in the same column of sub-pixels are sequentially coupled to form an integral structure.

As shown in FIG. 1, taking a sub-pixel driving circuit as an example, the sub-pixel driving circuit includes seven thin film transistors and one capacitor. Each transistor included in the sub-pixel driving circuit adopts a P-type transistor, the first electrode of each transistor includes a source electrode, and the second electrode of each transistor includes a drain electrode.

The first transistor T1 has a double-gate structure. The gate electrode 201g of the first transistor T1 (that is, the compensation transistor) is coupled to the sub-gate line 92 through the seventh via hole 807. The source electrode S1 of the first transistor T1 is coupled to the drain electrode D3 of the third transistor T3 (that is, the driving transistor), and the drain electrode D1 of the first transistor T1 is coupled to the gate electrode 203g of the third transistor T3 through the eighth via hole 808, the second conductive connection portion 62 and the ninth via hole 809.

The second transistor T2 (the reset transistor) has a double-gate structure. The gate electrode 202g of the second transistor T2 is coupled to the sub-reset signal line 95, and the source electrode S2 of the second transistor T2 is coupled to the sub-initialization signal line 941 through the third via hole 803. The drain electrode D2 of the second transistor T2 is coupled to the drain electrode D1 of the first transistor T1. The third via hole 803 penetrates the first gate insulating layer, the second gate insulating layer and the interlayer insulating layer.

The gate electrode 204g of the fourth transistor T4 (the data writing transistor) is coupled to the sub-gate line 92, and the source electrode S4 of the fourth transistor T4 is coupled to the first sub-data line 981 or the second sub-data line 982, the drain electrode D4 of the fourth transistor T4 is coupled to the source electrode S3 of the third transistor T3.

The gate electrode 205g of the fifth transistor T5 is coupled to the sub-light emitting control signal line 93, and the source electrode S5 of the fifth transistor T5 is coupled to the second sub-power supply line 912 through the thirteenth via hole 813, the first conductive connection portion 61 and the first via hole 801, and the drain electrode D5 of the fifth transistor T5 is coupled to the source electrode S3 of the third transistor T3. The thirteenth via hole 813 penetrates the first gate insulating layer, the second gate insulating layer and the interlayer insulating layer.

The gate electrode 206g of the sixth transistor T6 is coupled to the light emitting control signal line pattern 93, the source electrode S6 of the sixth transistor T6 is coupled to the drain electrode D3 of the third transistor T3, and the drain electrode D6 of the sixth transistor T6 is coupled to the anode of the light emitting element EL through the eleventh via hole 811, the fifth conductive connecting portion 65, the twentieth via hole 820, the fourth conductive connecting portion 64, and the tenth via hole 810.

The gate electrode 207g of the seventh transistor T7 is coupled to the sub-reset signal line 95' in the next sub-pixel adjacent in the second direction, the drain electrode D7 of the seventh transistor T7 is coupled to the drain electrode D6 of the sixth transistor T6, the source electrode S7 of the seventh transistor T7 is coupled to the sub-initialization signal line 941' in the next sub-pixel adjacent to the second direction through the fifteenth via hole 815.

The first electrode plate Cst1 of the storage capacitor Cst is multiplexed as the gate electrode 203g of the third transistor T3, and the second electrode plate Cst2 of the storage capacitor Cst is coupled to the first sub-power supply line 911 through the sixteenth via hole 816 and the seventeenth via hole 817.

Figure 2:
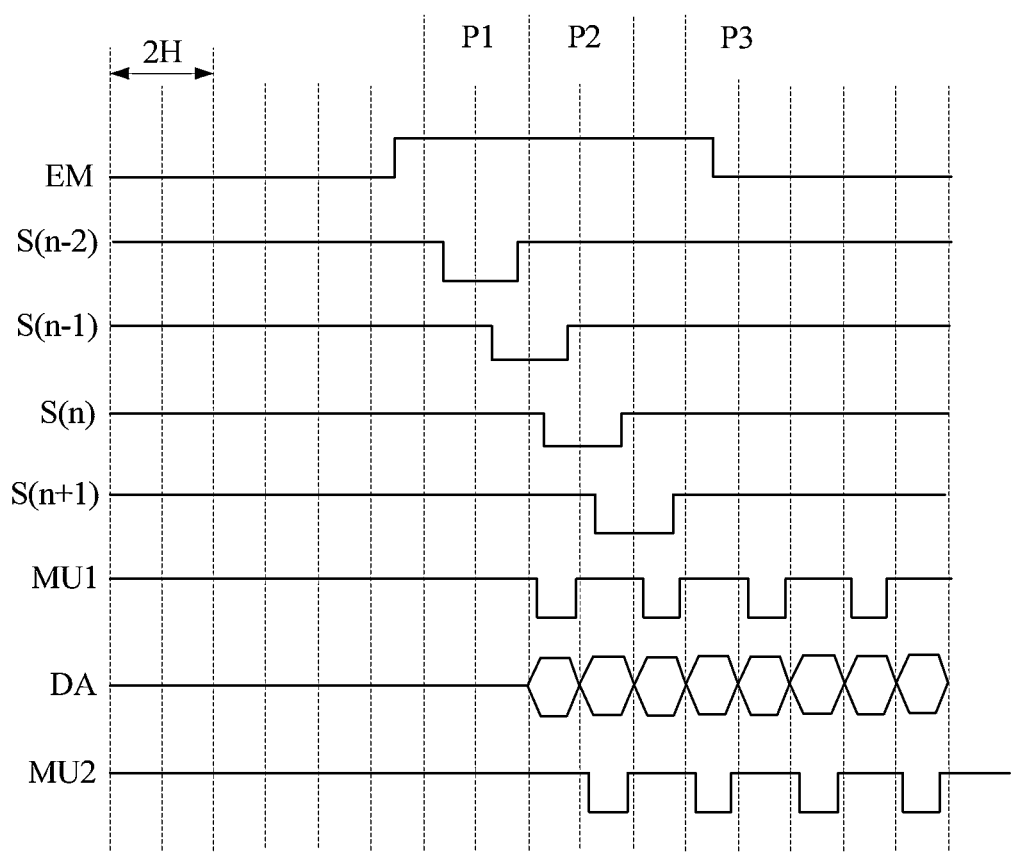
FIG. 2 is a working timing diagram of a sub-pixel driving circuit provided by an embodiment of the disclosure.

As shown in FIG. 2, when the sub-pixel driving circuit with the above structure is in operation, each work period includes a reset phase P1, a write compensation phase P2, and a light emitting phase P3. In FIG. 2, 2H represents the scan time of each line. EM represents a light emitting control signal transmitted on the sub-light emitting control signal line 93 in the current sub pixel. S(n−2) represents a reset signal transmitted on the sub-reset signal line 95 in the current sub-pixel. S(n−1) represents the reset signal transmitted on the sub-reset signal line 95' in the next row of sub-pixels. S(n) represents the scan signal transmitted on the sub-gate line 92 in the current sub-pixel. S(n+1) represents the scan signal transmitted on the sub-gate line in the next row of sub-pixels. MU1 represents the control signal received by the control terminal of the multiplexer for coupling the first sub-data line 981 to the second sub-data line 982 in the current sub-pixel. MU2 represents the control signal received by the control terminal of the multiplexer for coupling the first sub-data line 981 to the second sub-data line 982 in the adjacent next column of sub-pixels. DA represents the data signal transmitted on the first sub-data line 981 or the second sub-data line 982 in the current sub-pixel.

In the first reset phase P1, the reset signal S(n−2) inputted by the sub-reset signal line 95 is at a valid level, the second transistor T2 is turned on, and the initialization signal transmitted by the sub-initial signal line 941 is transmitted to the gate electrode 203g of the third transistor T3, so that the gate-source voltage Vgs maintained on the third transistor T3 in the previous frame is cleared to reset the gate electrode 203g of the third transistor T3.

In the write compensation phase P2, the reset signal S(n−2) inputted by the sub-reset signal line pattern 95 is at an invalid level, the second transistor T2 is turned off, and the scan signal S(n) inputted by the sub-gate line 92 is at a valid level, the first transistor T1 and the fourth transistor T4 are controlled to be turned on, and the corresponding first sub-data line 981 or the second sub-data line 982 writes the data signal DA and transmits the data signal DA to the source electrode S3 of the third transistor T3, at the same time, the first transistor T1 and the fourth transistor T4 are turned on, so that the third transistor T3 is formed as a diode structure, with the cooperation of the first transistor T1, the third transistor T3 and the fourth transistor T4, the compensation of the threshold voltage of the third transistor T3 is realized. When the compensation time is long enough, the potential of the gate electrode 203g of the third transistor T3 can be controlled to finally reach Vdata+Vth, where Vdata represents the voltage value of the data signal, and Vth represents the threshold voltage of the third transistor T3.

In the second half of the first reset phase P1 and the first half of the write compensation phase P2, the reset signal S(n−1) inputted by the sub-reset signal line 95' is at a valid level, and the seventh transistor T7 is controlled to be turned on, the initialization signal transmitted by the sub-initialization signal line 941' is inputted to the anode of the light emitting element EL to control the light emitting element EL not to emit light.

In the light emitting phase P3, the light emitting control signal EM written by sub-light emitting control signal line 93 is at a valid level, and the fifth transistor T5 and the sixth transistor T6 are controlled to be turned on, so that the power signal transmitted by the power signal line pattern 91 is inputted to the source electrode S3 of the third transistor T3, and the gate electrode 203g of the third transistor T3 is kept at Vdata+Vth, so that the third transistor T3 is turned on. The corresponding gate-source voltage of the third transistor T3 is Vdata+Vth-VDD, and VDD is the voltage value corresponding to the power supply signal, the leakage current generated based on the gate-source voltage flows to the anode of the corresponding light emitting element EL to drive the corresponding light emitting element EL to emit light.

When making the above sub-pixels, the layout of each layer corresponding to the sub-pixels is as follows.

An active layer, a first gate insulating layer, a first gate metal layer, a second gate insulating layer, a second gate metal layer, an interlayer insulating layer, and a first source-drain metal layer, a first planarization layer, a second source-drain metal layer, a second planarization layer, an anode layer, an organic light emitting function layer and a cathode layer are sequentially stacked in a direction away from the substrate.

As shown in FIG. 11, the active film layer is used to form the channel region (the portion covered by the gate electrode of each transistor), the source electrode (such as S1-S7) and the drain electrode (such as D1-D7) of each transistor in the sub-pixel driving circuit, the active film layer corresponding to the source electrode and drain electrode will have better conductivity than the active film layer corresponding to the channel region due to the doping effect; the active film layer can be amorphous silicon, polysilicon, oxide semiconductor materials. It should be noted that the aforementioned source electrode and drain electrode may be doped with n-type impurities or p-type impurities.

As shown in FIG. 12, the first gate metal layer is used to form the gate electrodes of the transistors in the sub-pixel driving circuit (for example: 201g-207g), and sub-light emitting control signal lines 93, first reset patterns 951 included in the sub-pixel, the gate electrode 203g of the third transistor T3 in each sub-pixel driving circuit is multiplexed as the first electrode plate Cst1 of the second storage capacitor Cst in the sub-pixel driving circuit.

As shown in FIG. 13, the second gate metal layer is used to form the second electrode plate Cst2 of the second storage capacitor Cst, the first shielding pattern 54, the second shielding pattern 55, the third shielding pattern 56, and the fourth shielding pattern 57.

As shown in FIG. 14, the first source-drain metal layer is used to form the second reset pattern 952, the sub-initialization signal line 941, the first conductive connection portion 61, the second conductive connection portion 62, and the third conductive connection portion 63, the fifth conductive connection portion 65, the sub-gate line 92, the first sub-power supply line 911, the power supply signal line pattern 91, the power compensation pattern and some conductive connection portions.

As shown in FIG. 15, the second source-drain metal layer is used to form the first sub-data line 981, the second sub-data line 982, the fourth conductive connection portion 64, the second sub-power supply line 912 and the compensation initialization signal line 942 included in the sub-pixel.

In addition, as shown in FIGS. 3 and 7, in the display substrate provided by the present disclosure, in the second direction, the gate electrode 204g of the fourth transistor T4, the gate electrode 201g of the first transistor T1, and the gate electrode of the second transistor T2 202g are all located on the first side of the gate electrode of the driving transistor (that is, the gate electrode 203g of the third transistor T3), the gate electrode of the seventh transistor T7, the gate electrode 206g of the sixth transistor T6, and the gate electrode of the fifth transistor T5 are all located at the second side of the gate electrode of the drive transistor. Exemplarily, the first side and the second side of the gate electrode of the driving transistor are two opposite sides along the second direction. Further, the first side of the gate electrode of the driving transistor may be the upper side of the gate electrode of the driving transistor. On the other hand, the second side of the gate electrode of the driving transistor may be the lower side of the gate electrode of the driving transistor. For example, the side of the display substrate for bonding the IC is the lower side of the display substrate, and the lower side of the gate electrode of the driving transistor is the side of the gate electrode of the driving transistor closer to the IC. The upper side is the opposite side of the lower side, for example, the side of the gate electrode of the driving transistor away from the IC.

In the first direction, the gate electrode 204g of the fourth transistor T4 and the gate electrode 205g of the fifth transistor T5 are both located on the third side of the gate electrode of the driving transistor. The gate electrode 201g of the first transistor T1 and the gate electrode 206g of the sixth transistor T6 are both located on the fourth side of the gate electrode of the driving transistor. Exemplarily, the third side and the fourth side of the gate electrode of the driving transistor are opposite sides along the first direction; further, the third side of the gate electrode of the driving transistor may be the right side of the gate electrode of the driving transistor, the fourth side of the gate electrode of the driving transistor may be the left side of the gate electrode of the driving transistor. For the left and right sides, for example, in the same sub-pixel, the second data line pattern 982 is located on the right side of the gate electrode of the driving transistor, and the first data line pattern 981 is located on the left side of the gate electrode of the driving transistor.

It should be further appreciated that, the above embodiments have been described in a progressive manner, and the same or similar contents in the embodiments have not been repeated, i.e., each embodiment has merely focused on the difference from the others. Especially, the product embodiments are substantially similar to the method embodiments, and thus have been described in a simple manner.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

The invention claimed is:

1. A display substrate, comprising:
   a plurality of sub-pixels,
   a plurality of reset signal lines, wherein at least part of the plurality of reset signal lines extend along a first direction; the plurality of reset signal lines include a sub-reset signal line corresponding to each sub-pixel, and the sub-reset signal line includes a first reset pattern and a second reset pattern coupled to each other, the first reset pattern is located between a substrate of the display substrate and the second reset pattern;
   a plurality of gate lines, at least part of the plurality of gate lines extending along the first direction;
   a plurality of light emitting control signal lines, at least part of the plurality of light emitting control signal lines extending along the first direction;
   a plurality of data lines, at least part of the plurality of data lines extending along a second direction, the first direction intersecting the second direction;
   a power signal line structure, at least part of the power signal line structure extending along the second direction; and
   an initialization signal line structure, at least part of the initialization signal line structure extending along the second direction.

2. The display substrate according to claim 1, wherein the sub-pixel includes a sub-pixel driving circuit, and a plurality of sub-pixel driving circuits of the plurality of sub-pixels are arranged in an array on the display substrate,
   the plurality of sub-pixel driving circuits form a plurality of repeating units arranged in an array,
   the sub-pixel driving circuit includes: a driving transistor, a compensation transistor, a data writing transistor, and a storage capacitor,
   a first electrode of the driving transistor is coupled to a second electrode of the data writing transistor, a second electrode of the driving transistor is coupled to a first electrode of the compensation transistor, and a gate electrode of the driving transistor is coupled to a second electrode of the compensation transistor; the gate electrode of the drive transistor is multiplexed as a first electrode plate of the storage capacitor; the driving transistor includes a channel region,
   the compensation transistor has a double-gate structure, and the compensation transistor includes a compensation active pattern.

3. The display substrate according to claim 2, wherein:
   the plurality of data lines includes a plurality of first data lines and a plurality of second data lines, and the plurality of first data lines includes a first sub-data line corresponding to each sub-pixel, and the plurality of second data lines includes a second sub-data line corresponding to each sub-pixel, in each sub-pixel, the first electrode of the data writing transistor is coupled to the first sub-data line or the second sub-data line.

4. The display substrate according to claim 3, wherein the sub-pixel further includes a first shielding pattern coupled to the second electrode plate of the storage capacitor, at least part of the shielding pattern extends along the second direction.

5. The display substrate according to claim 4, wherein an orthographic projection of the first shielding pattern on the substrate of the display substrate is arranged between the orthographic projection of the second electrode of the compensation transistor on the substrate, and the orthographic projection of the first electrode of the data writing transistor on the substrate.

6. The display substrate according to claim 4, wherein the sub-pixel further includes a second shielding pattern, and the second shielding pattern includes a first shielding portion and a second shielding portion coupled to each other, the first shielding portion is coupled to the first shielding pattern, at least part of the first shielding portion extends along the first direction, and at least part of the second shielding portion extends along the second direction.

7. The display substrate according to claim 6, wherein the compensation active pattern includes: two first semiconductor portions, and a second conductor portion coupled to the two first semiconductor portions, respectively;
an orthographic projection of the second shielding portion on the substrate of the display substrate at least partially overlaps an orthographic projection of the second conductor portion on the substrate.

8. The display substrate according to claim 6, wherein the orthographic projection of the second shielding portion on the substrate of the display substrate overlaps an orthographic projections of the first sub-data line on the substrate.

9. The display substrate according to claim 6, wherein a part of the sub-pixels further includes a third shielding pattern coupled to the first shielding pattern; in a part of the sub-pixels, an orthographic projection of the third shielding pattern on the substrate of the display substrate overlaps an orthographic projection of the second sub-data line on the substrate, wherein, in at least part of the sub-pixels, the third shielding pattern is located on a first side of the first shielding pattern, the second shielding pattern is located on a second side of the first shielding pattern, and the first side is opposite to the second side along the first direction.

10. The display substrate according to claim 3, wherein a part of the sub-pixels further include: a third conductive connection portion, at least part of the third conductive connection portion extends along the first direction, in one sub-pixel, a first end of the third conductive connection portion is coupled to the first sub-data line, and a second end of the third conductive connection portion is coupled to the first electrode of the data writing transistor.

11. The display substrate according to claim 10, wherein:
at least part of the first sub-data line includes a first straight side portion and a first bending portion, and the first straight side portion extends along the second direction, there is an angle between the first bending portion and the first straight side portion;
at least part of the second sub-data line includes a second straight side portion and a second bending portion, the second straight side portion extends along the second direction, and there is an angle between the second bending portion and the second straight side portion, wherein the display substrate further includes: an insulating layer located between the third conductive connecting portion and the first sub-data line, a via hole is provided on the insulating layer, and the third conductive connection portion is coupled to the first sub-data line through the via hole; an orthographic projection of the via hole on the substrate at least partially overlaps an orthographic projection of the first bending portion on the substrate.

12. The display substrate according to claim 2, wherein the initialization signal line structure includes: a plurality of first initialization signal lines and a plurality of compensation initialization signal lines, at least part of the first initialization signal lines extend along the first direction, at least part of the compensation initialization signal lines extend along the second direction, and at least one compensation initialization signal line is coupled to at least one of the plurality of first initialization signal lines.

13. The display substrate according to claim 12, wherein each compensation initialization signal line is respectively coupled to the plurality of first initialization signal lines.

14. The display substrate according to claim 12, wherein the driving transistor includes a driving active pattern,
in repeating units that are adjacent in the first direction, there is a first spacer region between driving active patterns of two driving transistors close to each other; in one repeating unit, there is a second spacer region between driving active patterns of two adjacent driving transistors along the first direction, and a width of the first spacer region in the first direction is greater than a width of the second spacer region, wherein an orthographic projection of the compensation initialization signal line on the substrate at least partially overlaps an orthographic projection of the first spacer region on the substrate.

15. The display substrate according to claim 12, wherein the sub-pixel further comprises:
a reset transistor, wherein a first electrode of the reset transistor is coupled to the initialization signal line structure, and a second electrode of the reset transistor is coupled to the gate electrode of the driving transistor, the reset transistor includes a reset active pattern, the reset active pattern includes two second semiconductor portions, and a third conductor portion respectively coupled to the two second semiconductor portions; and
a fourth shielding pattern, wherein the fourth shielding pattern is coupled to the power signal line structure, an orthographic projection of the fourth shielding pattern on the substrate of the display substrate at least partially overlaps an orthographic projection of the third conductor portion on the substrate, wherein the plurality of first initialization signal lines include a sub-initialization signal line corresponding to each sub-pixel; in at least part of the sub-pixels, an orthographic projection of the sub-reset signal line on the substrate of the display substrate is located between an orthographic projection of the sub-initialization signal line on the substrate and an orthographic projection of the fourth shielding portion on the substrate.

16. The display substrate according to claim 12, wherein the power signal line structure includes: a first sub-power supply line corresponding to each sub-pixel and a second sub-power supply line corresponding to each sub-pixel, at least part of the first sub-power supply line extends along the first direction, and at least part of the second sub-power supply line extends along the second direction; in one sub-pixel, the first sub-power supply line is coupled to the second sub-power supply line, and the first sub-power supply line is coupled to the second electrode plate of the storage capacitor.

17. The display substrate according to claim 16, wherein, in a same repeating unit, first sub-power supply lines located in a same row along the first direction are sequentially coupled, and in an adjacent repeating unit, there is a fourth spacer region between two first sub-power supply lines closest to each other along the first direction, wherein an orthographic projection of the compensation initialization signal line on the substrate at least partially overlaps an orthographic projection of the fourth spacer region on the substrate.

18. The display substrate according to claim 16, wherein the sub-pixel further includes a first conductive connection portion; in one sub-pixel, the first sub-power supply line is coupled to the first conductive connection portion, an orthographic projection of the first conductive connection portion on the substrate at least partially overlaps an orthographic projection of the second sub-power supply line on the substrate, and the first conductive connection portion is coupled to the second sub-power supply line through a via hole at the overlapping position, wherein the first conductive connection portion includes:

U-shaped sub-connecting portion, one end of the U-shaped sub-connecting portion is coupled to the first sub-power supply line in a sub-pixel to which the U-shaped sub-connecting portion belongs, and another end of the U-shaped sub-connecting portion is connected to a first sub-power supply line in an adjacent sub-pixel;

a first sub-connection portion coupled to the U-shaped sub-connection portion, an orthographic projection of the first sub-connection portion on the substrate of the display substrate overlaps the orthographic projection of the second sub-power supply line on the substrate, and the first sub-connecting portion and the second sub-power supply line are coupled through a via hole in the overlapping position.

19. The display substrate according to claim 16, wherein at least part of the second sub-power supply line includes a power supply straight side portion and a power supply bending portion, at least part of the power supply straight side portion extends along the second direction, there is an angle between the power supply bending portion and the power supply straight side portion, wherein the angle a satisfies:

90°≤a<180°.

20. The display substrate according to claim 2, wherein the compensation active pattern includes: a first conductor portion, the first conductor portion serves as the second electrode of the compensation transistor, and at least part of the first conductor part extends to the channel region of the driving transistor along the second direction.

21. The display substrate according to claim 2, wherein the gate electrode of the driving transistor includes a gate main body and a gate protrusion portion, an orthographic projection of the gate protrusion portion on the substrate of the display substrate at least partially overlaps an orthographic projection of the second electrode plate of the storage capacitor on the substrate, wherein the gate protrusion portion includes a first gate protrusion portion and a second gate protrusion portion, and the first gate protrusion portion and the second gate protrusion portion are symmetrically arranged.

22. The display substrate according to claim 2, wherein the plurality of gate lines includes a sub-gate line corresponding to each sub-pixel; in one sub-pixel, the gate electrode of the compensation transistor is coupled to the gate electrode of the data writing transistor in an adjacent sub-pixel, and an orthographic projection of the gate electrode of the compensation transistor on the substrate of the display substrate overlaps an orthographic projection of a corresponding sub-gate line on the substrate, the gate electrode of the compensation transistor is coupled to the corresponding sub-gate line through a via hole in the overlapping position, wherein an orthographic projection of the sub-gate line on the substrate of the display substrate at least partially overlaps the orthographic projection of the second electrode of the compensation transistor on the substrate.

23. The display substrate according to claim 2, wherein the second electrode plate of the storage capacitor includes a plate main body and two plate protrusion portions, and the plate main body is provided with an opening, a third spacer region is formed between the two plate protrusion portions.

24. The display substrate according to claim 23, wherein along the first direction, second electrode plates in adjacent sub-pixels are coupled together to form a coupling area, and along the second direction, a length of the coupling area is greater than or equal to a length of the plate main body.

25. The display substrate according to claim 23, wherein the sub-pixel further includes a second conductive connection portion, and at least part of the second conductive connection portion extends along the second direction; a first end of the second conductive connection portion is coupled to the gate electrode of the driving transistor, and a second end of the second conductive connection portion is coupled to the second electrode of the compensation transistor, an orthographic projection of the second end on the substrate at least partially overlaps the orthographic projection of the third spacer region on the substrate, wherein the orthographic projection of the second conductive connecting portion on the substrate does not overlap the orthographic projection of the gate line on the substrate.

26. The display substrate according to claim 2, wherein the sub-pixel further includes an anode pattern and a fourth conductive connection portion, in one sub-pixel, the sub-pixel driving circuit is coupled to a corresponding anode pattern through the fourth conductive connection portion;

at least part of the fourth conductive connection portion includes an extension portion extending along the second direction, and an orthographic projection of the extension portion on the substrate of the display substrate at least partially overlaps an orthographic projection of the anode pattern connected to the extension portion on the substrate, wherein the sub-pixel includes a plurality of first sub-pixels, a plurality of second sub-pixels, and a plurality of third sub-pixels, a fourth conductive connection portion in the first sub-pixel has a first length in the second direction, a fourth conductive connection portion in the second sub-pixel has a second length in the second direction, a fourth conductive connection portion in the third sub-pixel has a third length in the second direction; the first length is greater than the second length, and the third length is greater than the third length.

27. A display device comprising the display substrate according to claim 1, wherein the plurality of data lines in the display substrate include a plurality of first data lines and a plurality of second data lines, the plurality of data lines are divided into a plurality of data line groups, and each data line group includes a first data line and a second data line, the display device further includes:
a driver chip, the driver chip including a plurality of data signal output pins;

a plurality of multiplexers, the input ends of the plurality of multiplexers being coupled to the plurality of data signal output pins in a one-to-one manner; the plurality of multiplexers correspond to the plurality of data line groups in a one-to-one manner, a first output end of the multiplexer is coupled to a first data line in a corresponding data line group, and a second output end of the multiplexer is coupled to a second data line in the corresponding data line group.

* * * * *